(12) United States Patent  (10) Patent No.: US 9,421,617 B2
Goodman et al.  (45) Date of Patent: Aug. 23, 2016

(54) SUBSTRATE HOLDER

(75) Inventors: Daniel Goodman, Lexington, MA (US);
Arthur Keigler, Wellesley, MA (US);
David G. Guarnaccia, Carlisle, MA
(US)

(73) Assignee: TEL NEXX, INC., Billerica, MA (US)

( * ) Notice: Subject to any disclaimer, the term of this patent is extended or adjusted under 35 U.S.C. 154(b) by 1128 days.

(21) Appl. No.: 13/356,252

(22) Filed: Jan. 23, 2012

(65) Prior Publication Data

US 2012/0325275 A1 Dec. 27, 2012

Related U.S. Application Data

(60) Provisional application No. 61/499,883, filed on Jun. 22, 2011.

(51) Int. Cl.
B23B 31/14 (2006.01)
H01L 21/687 (2006.01)
F26B 5/08 (2006.01)
B23B 31/12 (2006.01)

(52) U.S. Cl.
CPC ............. *B23B 31/14* (2013.01); *B23B 31/1261* (2013.01); *F26B 5/08* (2013.01); *H01L 21/68728* (2013.01); *Y10T 279/18* (2015.01); *Y10T 279/247* (2015.01)

(58) Field of Classification Search
CPC .. B23B 31/1261; B23B 31/14; Y10T 279/18; Y10T 279/247
USPC .................................................. 279/106, 131
See application file for complete search history.

(56) References Cited

U.S. PATENT DOCUMENTS

| 2,593,706 | A | * | 4/1952 | Von Zelewsky | 279/33 |
| 3,623,962 | A | | 11/1971 | Beale | |
| 3,993,018 | A | * | 11/1976 | Kranik et al. | 118/52 |
| 4,170,888 | A | * | 10/1979 | Golata | 72/82 |
| 4,313,266 | A | | 2/1982 | Tam | |
| 4,336,870 | A | * | 6/1982 | Shea | 192/105 CF |
| 4,439,261 | A | | 3/1984 | Pavone et al. | |
| 4,489,740 | A | | 12/1984 | Rattan et al. | |
| 4,651,440 | A | | 3/1987 | Karl | |
| 4,724,619 | A | | 2/1988 | Poli et al. | |
| 4,855,775 | A | | 8/1989 | Matsuoka | |
| 4,944,860 | A | | 7/1990 | Bramhall, Jr. et al. | |
| 5,032,217 | A | | 7/1991 | Tanaka | |
| 5,076,877 | A | | 12/1991 | Ueda et al. | |
| 5,092,975 | A | | 3/1992 | Yamamura et al. | |

(Continued)

FOREIGN PATENT DOCUMENTS

DE 3204987 A1 * 8/1983 ............. B23B 31/14
EP 0 444 756 A1 9/1991

(Continued)

*Primary Examiner* — Eric A Gates
(74) *Attorney, Agent, or Firm* — Rothwell, Figg, Ernst & Manbeck, P.C.

(57) ABSTRACT

A rotary chuck adapted to hold a substrate. The rotary chuck has a rotatable chuck portion and an edge grip having a movable grip member movably mounted to the rotatable chuck portion, the moveable grip member being substantially free moving so that rotation of the rotating chuck portion causes the moveable grip member to move in a plane substantially aligned with a surface of the substrate to engage the substrate in a engaged position. A resilient element is coupled to the moveable grip member, the resilient member biasing the grip member to a disengaged position.

6 Claims, 27 Drawing Sheets

(56) References Cited

U.S. PATENT DOCUMENTS

| | | | |
|---|---|---|---|
| 5,156,174 A | 10/1992 | Thompson et al. |
| 5,168,886 A | 12/1992 | Thompson et al. |
| 5,168,887 A | 12/1992 | Thompson et al. |
| 5,203,360 A | 4/1993 | Nguyen et al. |
| 5,222,310 A | 6/1993 | Thompson et al. |
| 5,224,504 A | 7/1993 | Thompson et al. |
| 5,238,500 A | 8/1993 | Bergman |
| 5,271,774 A | 12/1993 | Leenaars et al. |
| 5,312,532 A | 5/1994 | Andricacos et al. |
| 5,316,642 A | 5/1994 | Young, Jr. et al. |
| 5,349,978 A | 9/1994 | Sago et al. |
| 5,357,991 A | 10/1994 | Bergman et al. |
| 5,365,031 A | 11/1994 | Mumola |
| 5,375,291 A | 12/1994 | Tateyama et al. |
| 5,421,056 A | 6/1995 | Tateyama et al. |
| 5,421,987 A | 6/1995 | Tzanavaras et al. |
| 5,431,421 A | 7/1995 | Thompson et al. |
| 5,445,172 A | 8/1995 | Thompson et al. |
| 5,513,668 A | 5/1996 | Sumnitsch |
| 5,516,412 A | 5/1996 | Andricacos et al. |
| 5,518,542 A | 5/1996 | Matsukawa et al. |
| 5,520,743 A | 5/1996 | Takahashi |
| 5,558,110 A | 9/1996 | Williford, Jr. |
| 5,562,113 A | 10/1996 | Thompson et al. |
| 5,566,466 A | 10/1996 | Hearne |
| 5,568,821 A | 10/1996 | Ohmori et al. |
| 5,573,023 A | 11/1996 | Thompson et al. |
| 5,591,262 A | 1/1997 | Sago et al. |
| 5,666,985 A | 9/1997 | Smith, Jr. et al. |
| 5,706,843 A | 1/1998 | Matsuo |
| 5,715,610 A | 2/1998 | Smith, Jr. et al. |
| 5,738,128 A | 4/1998 | Thompson et al. |
| 5,738,574 A | 4/1998 | Tolles et al. |
| 5,753,133 A | 5/1998 | Wong et al. |
| 5,775,000 A | 7/1998 | Maekawa et al. |
| 5,778,554 A | 7/1998 | Jones |
| 5,829,156 A | 11/1998 | Shibasaki et al. |
| 5,845,662 A | 12/1998 | Sumnitsch |
| 5,851,041 A | 12/1998 | Anderson et al. |
| 5,857,475 A | 1/1999 | Volk |
| 5,861,061 A | 1/1999 | Hayes et al. |
| 5,863,340 A | 1/1999 | Flanigan |
| 5,879,576 A | 3/1999 | Wada et al. |
| 5,882,433 A | 3/1999 | Ueno |
| 5,895,549 A | 4/1999 | Goto et al. |
| 5,954,072 A | 9/1999 | Matusita |
| 5,954,911 A | 9/1999 | Bergman et al. |
| 5,966,635 A | 10/1999 | Hiatt et al. |
| 5,966,765 A | 10/1999 | Hamada et al. |
| 5,972,127 A | 10/1999 | Thompson et al. |
| 5,974,681 A | 11/1999 | Gonzalez Martin et al. |
| 6,062,239 A | 5/2000 | Bexten |
| 6,074,544 A | 6/2000 | Reid et al. |
| 6,099,702 A | 8/2000 | Reid et al. |
| 6,125,863 A | 10/2000 | Bexten |
| 6,140,253 A | 10/2000 | Hayes et al. |
| 6,159,288 A | 12/2000 | Satou et al. |
| 6,167,893 B1 | 1/2001 | Taatjes et al. |
| 6,168,660 B1 | 1/2001 | Hayes et al. |
| 6,182,675 B1 | 2/2001 | Naka et al. |
| 6,203,582 B1 | 3/2001 | Berner et al. |
| 6,258,220 B1 | 7/2001 | Dordi et al. |
| 6,267,853 B1 * | 7/2001 | Dordi et al. ................... 204/232 |
| 6,273,104 B1 | 8/2001 | Shinbara et al. |
| 6,273,484 B1 * | 8/2001 | Peng ........................... 294/86.4 |
| 6,292,972 B1 | 9/2001 | Ishihara et al. |
| 6,309,524 B1 | 10/2001 | Woodruff et al. |
| 6,334,902 B1 | 1/2002 | Mertens et al. |
| 6,357,457 B1 | 3/2002 | Taniyama et al. |
| 6,363,623 B1 | 4/2002 | Abraham |
| 6,391,110 B1 | 5/2002 | Satou et al. |
| 6,391,209 B1 | 5/2002 | Belongia et al. |
| 6,398,879 B1 | 6/2002 | Satou et al. |
| 6,412,503 B1 | 7/2002 | Lerner et al. |
| 6,417,117 B1 | 7/2002 | Davis |
| 6,432,214 B2 | 8/2002 | Bryer et al. |
| 6,454,918 B1 | 9/2002 | Sakaki |
| 6,491,764 B2 | 12/2002 | Mertens et al. |
| 6,511,540 B1 | 1/2003 | Davis |
| 6,516,815 B1 | 2/2003 | Stevens et al. |
| 6,517,689 B1 | 2/2003 | Hongo et al. |
| 6,536,454 B2 | 3/2003 | Lindner |
| 6,537,416 B1 | 3/2003 | Mayer et al. |
| 6,577,382 B2 | 6/2003 | Kida et al. |
| 6,578,853 B1 | 6/2003 | Treur et al. |
| 6,599,571 B2 | 7/2003 | Davis |
| 6,612,014 B1 | 9/2003 | Donoso et al. |
| 6,645,344 B2 | 11/2003 | Caldwell et al. |
| 6,708,701 B2 | 3/2004 | Emami |
| 6,752,442 B2 | 6/2004 | McNurlin et al. |
| 6,770,149 B2 | 8/2004 | Satou et al. |
| 6,770,565 B2 | 8/2004 | Olgado et al. |
| 6,786,996 B2 | 9/2004 | Emami |
| 6,807,972 B2 | 10/2004 | Chiu et al. |
| 6,811,618 B2 | 11/2004 | Kuroda |
| 6,824,343 B2 | 11/2004 | Kurita et al. |
| 6,824,612 B2 | 11/2004 | Stevens et al. |
| 6,827,092 B1 | 12/2004 | Smith et al. |
| 6,874,790 B2 * | 4/2005 | Sundkvist ........................ 279/35 |
| 6,913,651 B2 | 7/2005 | Ivanov et al. |
| 6,921,466 B2 | 7/2005 | Hongo et al. |
| 6,935,638 B2 * | 8/2005 | Ivanov et al. .................. 279/106 |
| 6,964,724 B2 | 11/2005 | Yamasaki et al. |
| 6,967,174 B1 | 11/2005 | Mayer et al. |
| 7,000,622 B2 | 2/2006 | Woods et al. |
| 7,000,623 B2 | 2/2006 | Welsh et al. |
| 7,087,122 B2 | 8/2006 | Smith et al. |
| 7,094,291 B2 | 8/2006 | Reardon et al. |
| 7,128,823 B2 | 10/2006 | Yang et al. |
| 7,138,016 B2 | 11/2006 | Reardon et al. |
| 7,201,808 B2 | 4/2007 | Chiu et al. |
| 7,223,323 B2 | 5/2007 | Yang et al. |
| 7,226,055 B1 | 6/2007 | Bettencourt et al. |
| 7,241,372 B2 | 7/2007 | Sendai et al. |
| 7,247,222 B2 | 7/2007 | Yang et al. |
| 7,256,132 B2 | 8/2007 | Lerner et al. |
| 7,306,002 B2 | 12/2007 | Kim et al. |
| 7,399,713 B2 | 7/2008 | Aegerter et al. |
| 7,402,227 B2 | 7/2008 | Yoshioka et al. |
| 7,404,407 B2 | 7/2008 | Orii et al. |
| 7,429,537 B2 | 9/2008 | Aegerter et al. |
| 7,518,288 B2 | 4/2009 | Bran |
| 7,520,939 B2 | 4/2009 | Ho et al. |
| 7,651,306 B2 | 1/2010 | Rice et al. |
| 7,670,465 B2 | 3/2010 | Yang et al. |
| 7,694,647 B2 | 4/2010 | Ishikawa et al. |
| 7,735,710 B2 | 6/2010 | Kurita et al. |
| 7,743,728 B2 | 6/2010 | Ishikawa et al. |
| 7,780,867 B1 | 8/2010 | Mayer et al. |
| 7,798,764 B2 | 9/2010 | Rice et al. |
| 7,807,027 B2 | 10/2010 | Yoshioka et al. |
| 7,811,422 B2 | 10/2010 | Zimmerman |
| 7,819,079 B2 | 10/2010 | Englhardt et al. |
| 7,833,393 B2 | 11/2010 | Yoshioka et al. |
| 7,862,658 B2 | 1/2011 | Yamasaki et al. |
| 7,866,058 B2 | 1/2011 | Kim et al. |
| 7,922,440 B2 | 4/2011 | Du Bois et al. |
| 7,925,377 B2 | 4/2011 | Ishikawa et al. |
| 7,938,131 B2 | 5/2011 | Hahn et al. |
| 7,988,817 B2 | 8/2011 | Son |
| 8,348,255 B2 * | 1/2013 | Munakata ........................ 269/57 |
| 9,190,310 B2 * | 11/2015 | Brugger .............. H01L 21/6838 |
| 2002/0066475 A1 | 6/2002 | Verhaverbeke et al. |
| 2003/0000034 A1 | 1/2003 | Welsh et al. |
| 2004/0194817 A1 | 10/2004 | Pope et al. |
| 2009/0108545 A1 * | 4/2009 | Kwon et al. .................. 279/106 |
| 2010/0043839 A1 | 2/2010 | Hamada et al. |
| 2013/0219693 A1 * | 8/2013 | Wu et al. ........................ 29/559 |

FOREIGN PATENT DOCUMENTS

| | | |
|---|---|---|
| EP | 0 444 756 B1 | 11/1995 |
| EP | 0 898 301 A2 | 2/1999 |
| EP | 0 905 747 A1 | 3/1999 |

(56) References Cited

FOREIGN PATENT DOCUMENTS

| | | |
|---|---|---|
| EP | 0 898 301 A3 | 11/2000 |
| EP | 0 905 747 B1 | 11/2005 |
| EP | 0 898 301 B1 | 9/2006 |
| FR | 2540017 A1 * | 8/1984 |
| JP | 57-207571 A | 12/1982 |
| JP | 1-116094 A | 5/1989 |
| JP | 2-138737 A | 5/1990 |
| JP | 5-206348 A | 8/1993 |
| JP | 8-134699 A | 5/1996 |
| JP | 11-152597 A | 6/1999 |

* cited by examiner

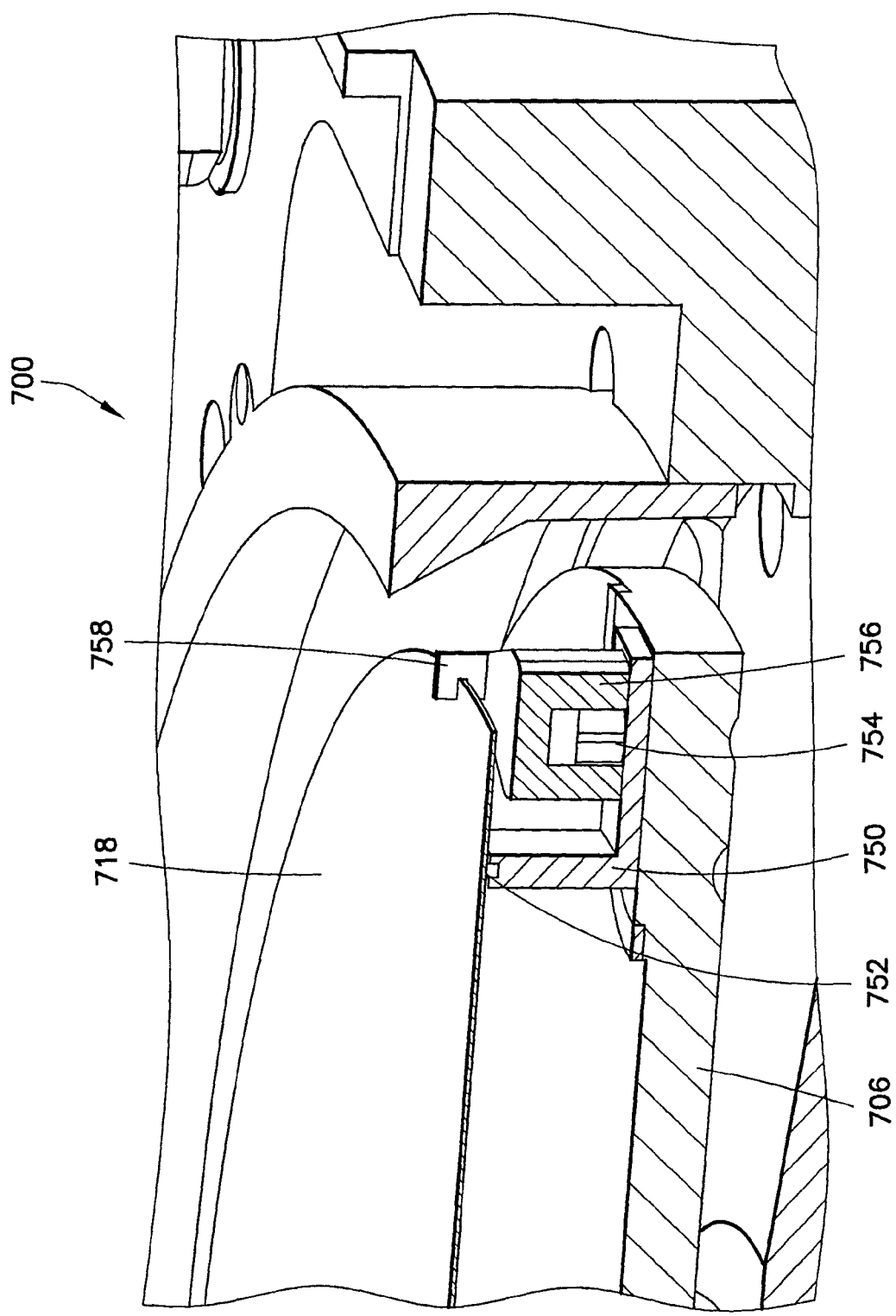

SUBSTRATE HOLDER

RELATED APPLICATIONS

This application claims the benefit of and priority from U.S. Provisional Patent Application Ser. No. 61/499,883 Entitled "SUBSTRATE HOLDER" and filed on Jun. 22, 2011 which is hereby incorporated by reference herein in its entirety.

BACKGROUND

1. Field

The disclosed embodiments relate generally to a substrate holder and more specifically to a substrate holder in a spin rinse dryer apparatus.

2. Brief Description of Related Developments

Fluid processing, among other processes, is used as a manufacturing technique for the application or removal of films and materials to various structures and surfaces, such as substrates such as semiconductor wafers and silicon work pieces or substrates. Fluid post processing may include a rinsing and drying step. One approach to rinsing and drying of the substrate involves rotating the substrate at high speed and dispensing a rinsing fluid on the surface of the substrate while subsequently allowing the substrate to dry, for example, in an atmospheric, nitrogen or otherwise, purged volume. A problem arises where retention, rotation and processing of substrates in a high speed rotational environment requires cleanliness and requires for the processing of thin or otherwise delicate substrates. Accordingly, there is a desire for new and improved methods and apparatus for processing substrates in a substrate spin rinse dryer application.

BRIEF DESCRIPTION OF THE DRAWINGS

The foregoing aspects and other features of the embodiments are explained in the following description, taken in connection with the accompanying drawings.

FIG. 47 shows an isometric section view of a spin rinse dry (SRD) module.

DETAILED DESCRIPTION OF THE EMBODIMENTS

Figure 1:
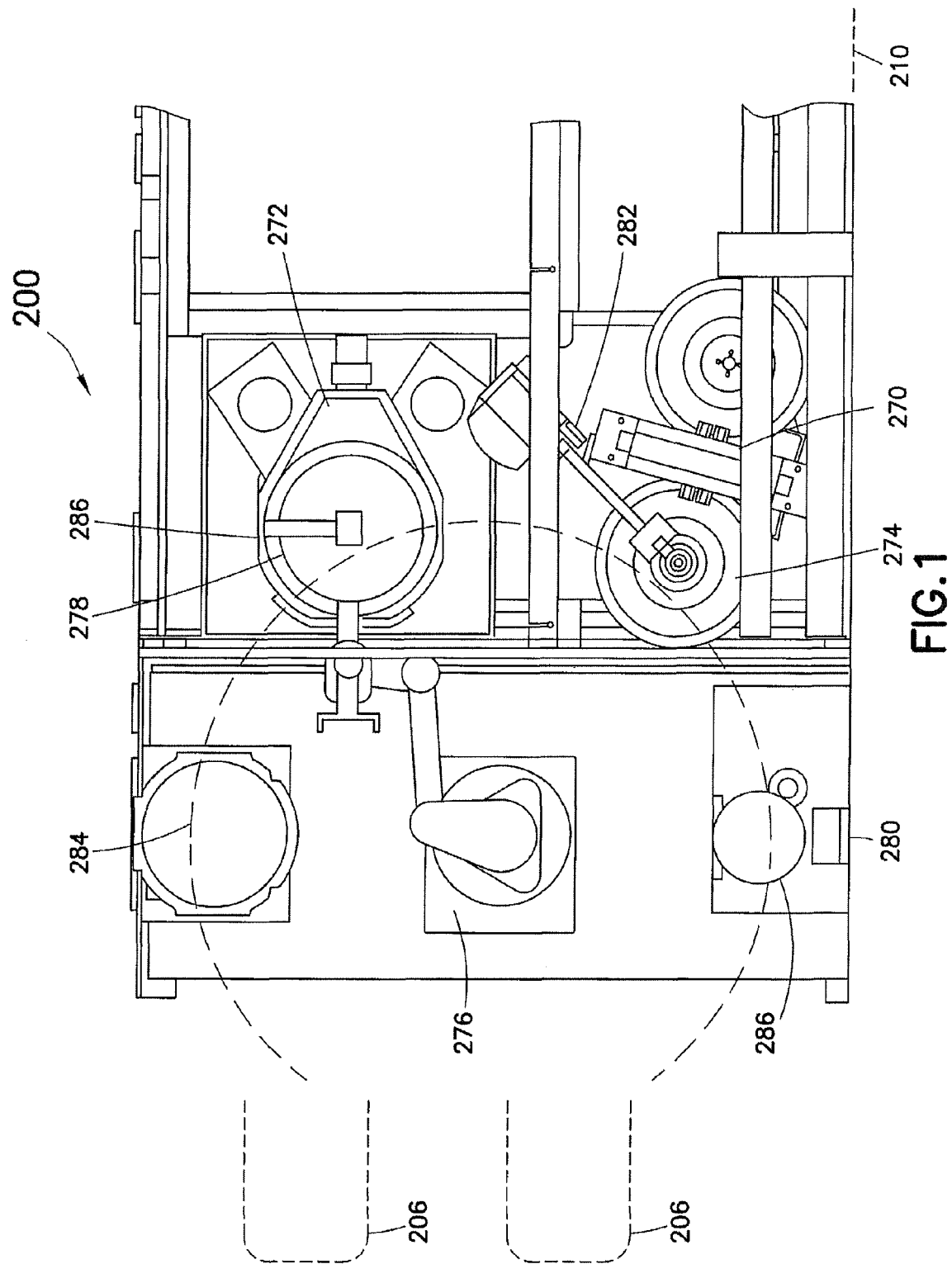
FIG. 1 shows an exemplary wafer processing system.

Although the present embodiments will be described with reference to the embodiments shown in the drawings, it should be understood that the embodiments can be embodied in many alternate forms of embodiments. In addition, any suitable size, shape or type of elements or materials could be used.

Referring now to FIG. 1, there is shown a wafer processing machine 200 suitable for a manufacturing process using the present disclosed embodiments. The disclosed embodiments may be implemented in an electro deposition machine such as the Stratus from NEXX Systems in Billerica Mass. System 200 may incorporate features as disclosed in the International Application WO 2005/042804 A2 published under the Patent Cooperation Treaty and having publication date May 12, 2005 and as disclosed in U.S. Publication No. 2005/0167275 published Aug. 14, 2005 and entitled method and apparatus for fluid processing a work piece, both of which are hereby incorporated by reference herein in their entirety. In alternate embodiments, the disclosed embodiments may be utilized in any suitable processing system or in combination with processing systems, for example cleaning systems, etching systems or any suitable system that may utilize rinsing and/or drying of substrates either alone or in combination. System 200 is shown as an exemplary system. In alternate embodiments, more or less modules may be provided having different configurations and locations. Machine 200 may contain load ports 206 by which substrates previously processed, such as being patterned with photoresist or otherwise processed are inserted and withdrawn from the system. Loading station 204 may have a robotic arm 276 which transfers substrates 278 into wafer loader module 274 where wafer loader module 274 may load wafer(s) to holders 270. Further, robotic arm 276 may transfer substrates 278 into spin rinse dry (SRD) module 272 where spin rinse dry (SRD) module 272 may clean, dry or otherwise process wafer(s) 278 as will be described in greater detail below. In FIG. 1, the relative location of the SRD system 272 within the front end of the automated system 200 is shown with the SRD stack 272 positioned within the motion envelope of the wafer robot 276. Further, robotic arm 276 may transfer substrates 278 into pre aligner 280, pick up flip (PUF) device 282 or buffer modules 284, 286. In alternate embodiments, more or less suitable modules may be provided in any suitable combination with spin rinse dry (SRD) module 272. For example, in alternate embodiments, robotic arm 276 may transport a single wafer, a batch of wafers or a combination thereof. In alternate embodiments, more or less modules may be provided, for example, more or less robotic arms, spin rinse dry modules or any suitable module may be provided in combination with spin rinse dry (SRD) module 272. Loading station 204 may support any suitable process 210 of system 200. For example, process modules 210 may include a combination of cleaning, etching and/or electro deposition modules. In alternate embodiments, more or less modules in more or less suitable combinations may be provided in any suitable combination. As such, all such variations, alternatives and modifications of system 200 configurations are herein embraced.

Spin rinse dry (SRD) module 272 may be provided to clean substrates or wafers, for example, after they have been unloaded from a Wafer Holder 282. Wafers may be unloaded and transferred to the spin rinse dry (SRD) module 272 after their wet processing has been completed. Spin rinse dry (SRD) module 272 may use DI (deionized) water or otherwise where no solvents or reagents may be used. Spin rinse dry (SRD) module 272 may operate at ambient temperature and pressure where module 272 may clean resist and EBR/contact regions at the wafer's edge; for example, the zone that may be covered by the contact ring seal (CRS) during plating, rinsing and drying operations. Spin rinse dry (SRD) module 272 may utilize directed nozzles 286 that apply clean DI rinse water to the wafer surface as it spins. The spin rinse dry (SRD) module 272 process may be divided into two principle stages; wash and dry. With the wash stage, the wafer revolves slowly while wash DI water is streamed onto the wafer under conditions of controlled pressure and flow. An exemplary low-speed wash revolves at 150 rpm. An exemplary wash time is in the range of approximately 15 seconds. An exemplary flow requirement is in the range of approximately 1 lpm where an exemplary pressure requirement is 50-60 psi. With the dry stage, after the preset time for the wash cycle, the wafer may be further processed for drying. Drying may accomplished by ejecting water from the surface by centrifugal force. The wafer is revolved at high speed until all trace water is gone from the surface, resulting in a clean, dry processed wafer. An exemplary high-speed dry revolves in the range from 2000-3000 rpm. Spin rinse dry (SRD) module 272 may be a single chamber able to hold, rinse and dry one wafer at a time. Spin rinse dry (SRD) module 272 chamber(s) may be optimized to dry at high speed; with an exemplary SRD processing time less than 60 seconds, total.

Figure 2:
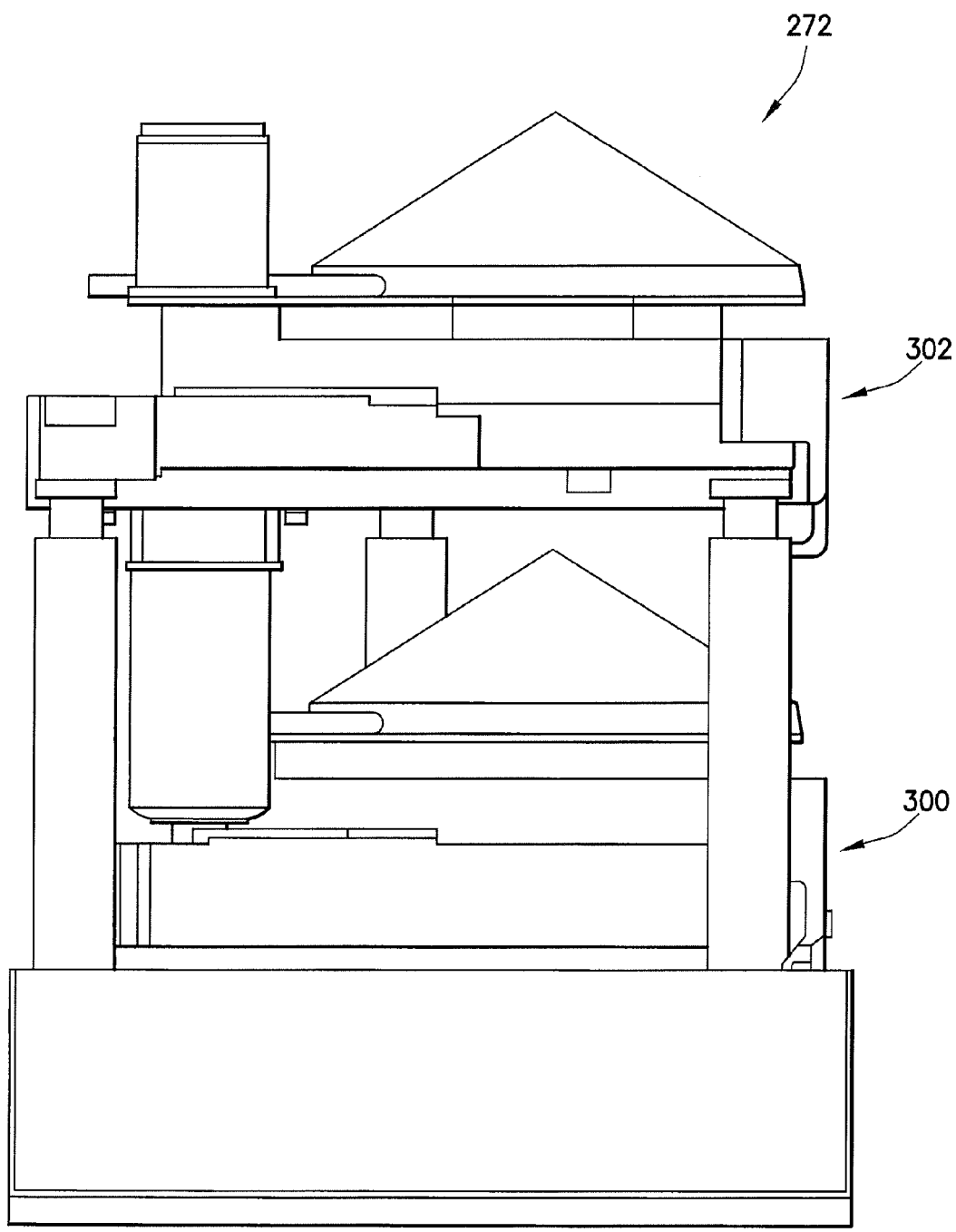
FIG. 2 shows a side view of a stacked spin rinse dry (SRD) module.
Figure 3:
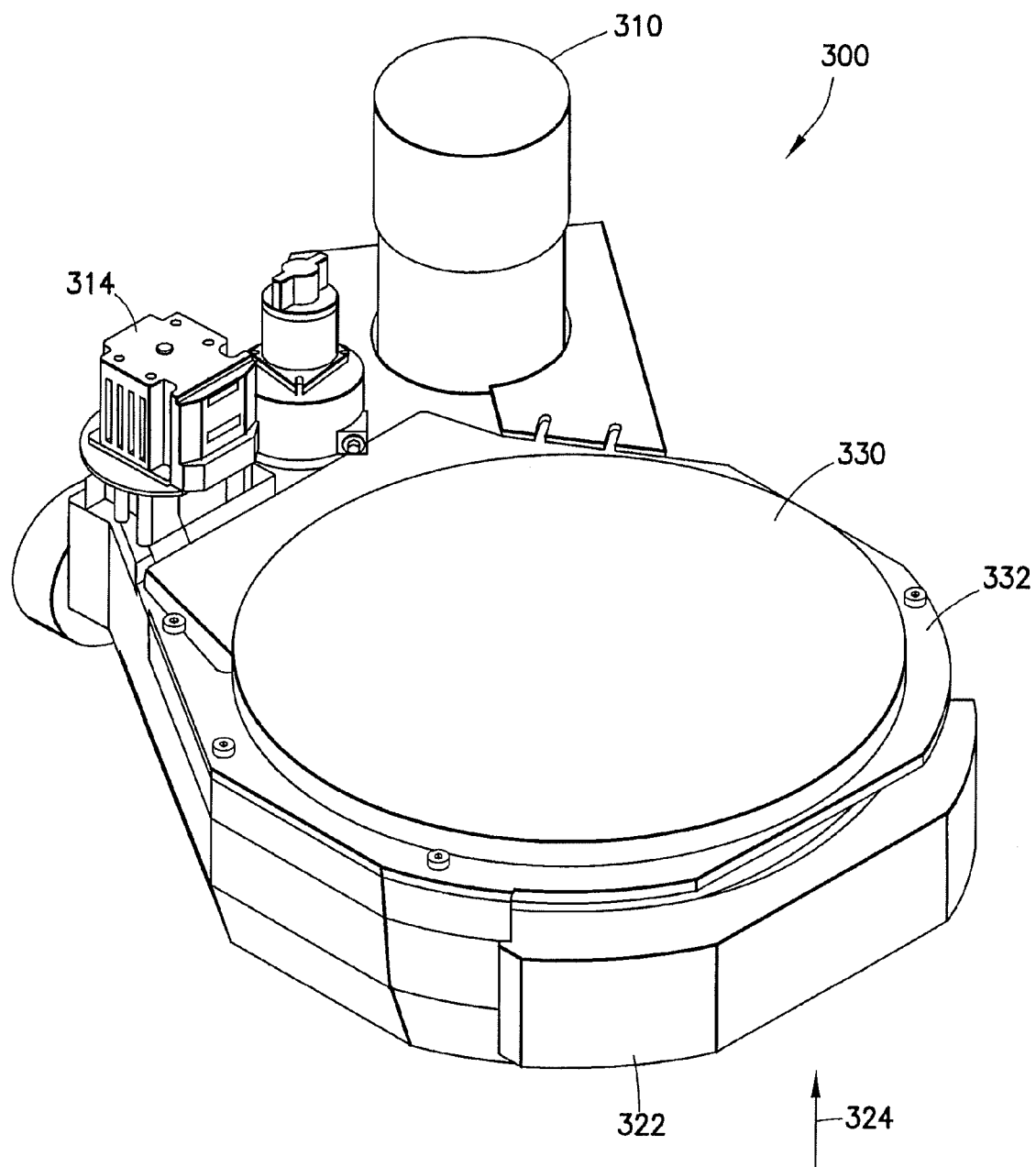
FIG. 3 shows an isometric view of a spin rinse dry (SRD) module.
Figure 4:
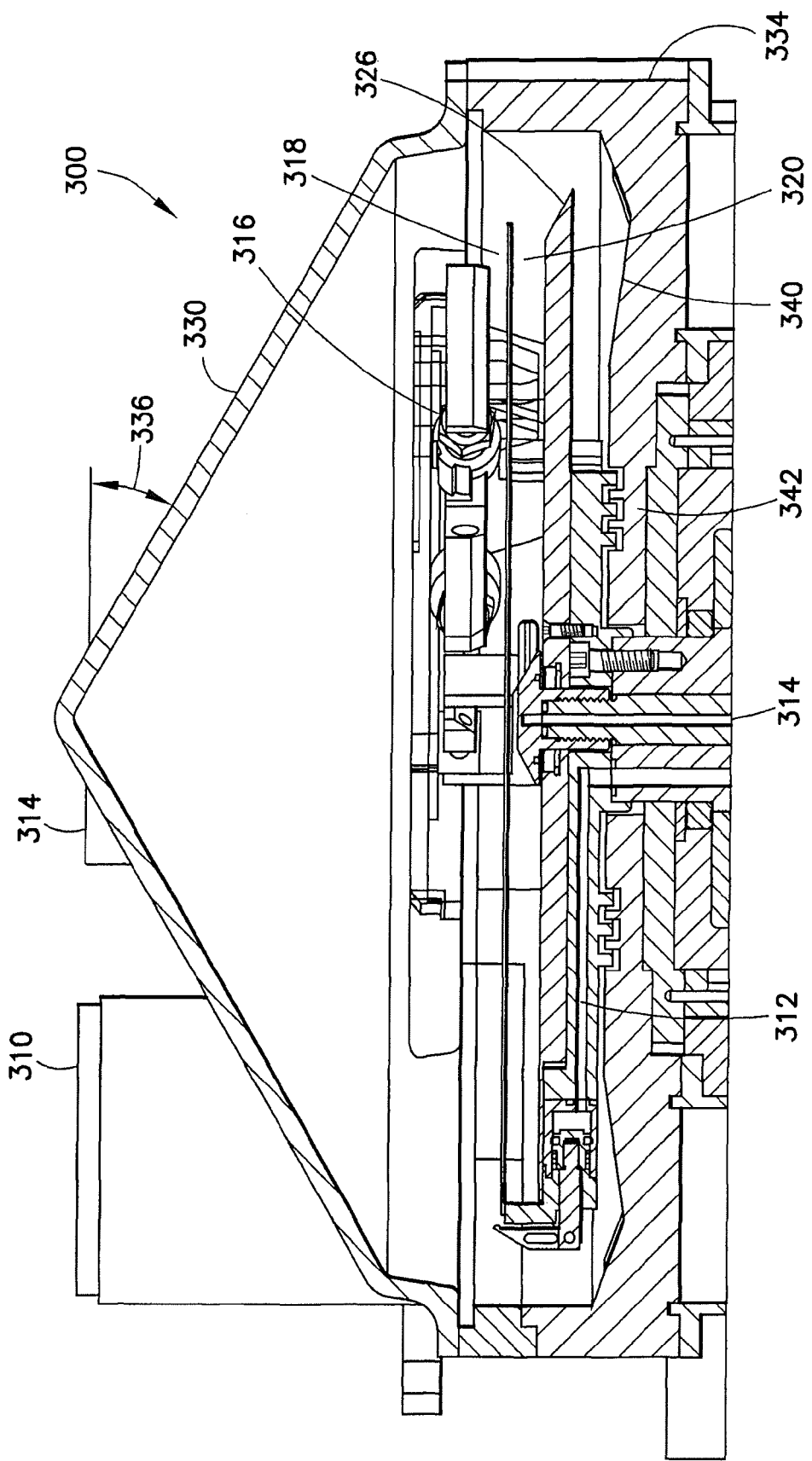
FIG. 4 shows a section view of a spin rinse dry (SRD) module.

Referring now to FIG. 2, there is shown a side view of a stacked spin rinse dry (SRD) module. Referring also to FIG. 3, there is shown an isometric view of a spin rinse dry (SRD) module. Referring also to FIG. 4, there is shown a section view of a spin rinse dry (SRD) module. As seen in FIG. 2, spin rinse dry (SRD) module 272 may be a stacked pair of modules 300, 302. Here, spin rinse dry (SRD) module 272 may be a stacked pair of chambers 300, 302 that can rinse and/or dry substrates operating in a parallel fashion. Each cleaning chamber 300, 302 may be fully independent and capable of operating on its own. Placing the chambers in the form of a vertical stack may save space, for example, in reducing the footprint of tool 200. Further, stacking the chambers may also locate the axis of wafer rotation in each of the chambers at essentially the same horizontal (X, Y) coordinate relative to the wafer robot simplifying robot servicing required to load and unload chambers. As can be seen in FIG. 3, an isometric view of spin rinse dry module 300 is shown. As further can be seen in FIG. 4, a section view of spin rinse dry module 300 is shown. Spin rinse dry module 300 has drive motor 310 which drives rotary chuck 312 through a drive belt where rotary chuck 312 is offset from drive motor 310. Here, rotary chuck 312 supports a wafer and rotates on an axis of rotation via spindle 314. In alternate embodiments, any suitable drive motor may be used to rotate chuck 312, such as where motor 310 is directly coupled to spindle 314 or otherwise. As will be described in greater detail below, a counter-weighted edge clamp may be mounted to rotary chuck 312 that pivots on a pivot axis offset from and substantially parallel to the axis of rotation of rotary chuck 312 where the counter-weighted edge clamp engages an edge of the substrate with a force activated by centripetal force upon the rotary chuck 312 exceeding a predetermined angular velocity. Nozzle drive 314 moves nozzle assembly 316 where nozzle assembly 316 may have an array of nozzles, for example, for dispensing DI water on the surface 318 of substrate 320 in a selectable dispense and or motion pattern of nozzle assembly 316. In alternate embodiments, nozzle assembly may be stationary or optionally not provided or otherwise. Door or gate 322 may be provided movable in direction 324 with a cylinder or other suitable method where door 322 is shown in a closed position in FIG. 3. Door 322 is provided to allow robot 276 to load and unload substrates from spin rinse dry module 300 when door 322 is in a lowered open position allowing robot 276 access to the interior 326 of module 300. When door 322 is in the closed position, door 322 prevents liquid from escaping the interior portion 326 of module 320, for example, during a clean or dry operation. Cover 330 is shown as a sloped or domed cover allowing liquid to drain beyond the outer edges of substrate 320 without dripping on the upper surface 318 of substrate 320 thus preventing spots or residue on surface 318. Cover 330 may be thermoformed HDPE or otherwise fabricated with slots 332 allowing the cover to be bolted to the top Module frame 334. The top cover 330 angle 336 is shown approximately at 30 degrees but alternately may be at a different angle. In the embodiment shown, cover 330 is separated from all critical mounting or alignment requirements and allows for debug and inspection without affecting critical adjustments, for example, the EBE arm adjustment where cover 330 may be removable without affecting operation or access to critical components of module 300 for setup, debug or test or otherwise. Cover 330, door 322 and/or frame 334 make up an enclosure and may alternately include a viewing port or window (not shown). Module 300 is shown as including features for elimination of water drips onto the wafer surface 318 from above, elimination of splashing, reduction of atmospheric oxygen by 10× within chamber, etch width tolerance of +/−0.3 mm in EBE process, no etchant drips after completion of etch process, the ability to rotate unclamped wafer from 0-200 RPM with the modified modules to fit within existing system space allocation or otherwise. Module 300 may be provided with flexibility including the ability to modify process implementation through modular sub components, for example, including a nozzle configurations for EBE and rinse nozzles and "Domed" Cover as a "Cover only" with no critical component mountings or otherwise. In the embodiment shown, cover 330 in combination with frame 334 and closed door 322 provide for fluid containment and collection where trough 340 is provided in frame 334 for drainage and removal of liquid. Further labyrinth 342 may be provided to prevent liquid from entering spindle portion 314.

As will be described in greater detail below, an edge grip wafer or substrate holder 312 in spin rinse dryer apparatus 300 and method of holding wafer 320 on chuck 312 in the context of the use of an SRD module 300 is shown. Chuck 312 may incorporate an edge grip feature as opposed to a vacuum chuck or otherwise to secure substrate 320 during rotation of chuck 312. Alternately, the edge grip feature may be used in any suitable module or cycle similar to or different than the exemplary cycle below.

Exemplary Cycle:
1. Wash cycle—slow rotate the wafer 320 and dispense water with nozzle array 316, wand or otherwise to fully saturate the wafer surface 318 for 10-30 seconds or otherwise typically approximately 50 rpm.
2. Shut off water and exhaust the interior of the SRD 300 with dry air or Nitrogen
3. Fast spin in dry air or nitrogen approximately 2400 rpm (3000 rpm maximum)
4. Stop, ungrip and open the slot 322 in the front access portion of the SRD 300 for wafer removal (the shutter on the front of the module opens and closes exposing a slot for wafer access).

As will be described, the disclosed chuck 312 uses rotation and inertia to clamp the edge of the wafer 320 and touches the peripheral edge using a combination weight and counter spring which determines the angular velocity at which the grips engage the edge forming a "rocker arm centripetal force edge grip". Here, the edge grip is activated by centripetal force, eliminating the need for vacuum chucking. Further, the edge grip also centers the wafer, eliminating the need for flippers.

Figure 5:
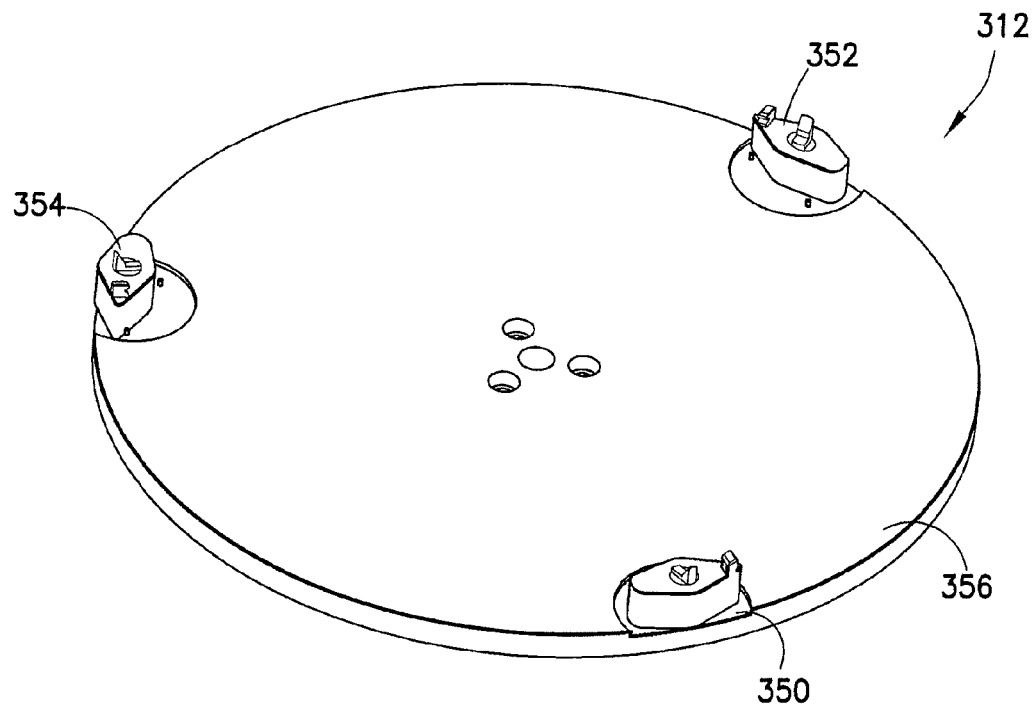
FIG. 5 shows a rocker arm with spring return chuck.
Figure 6:
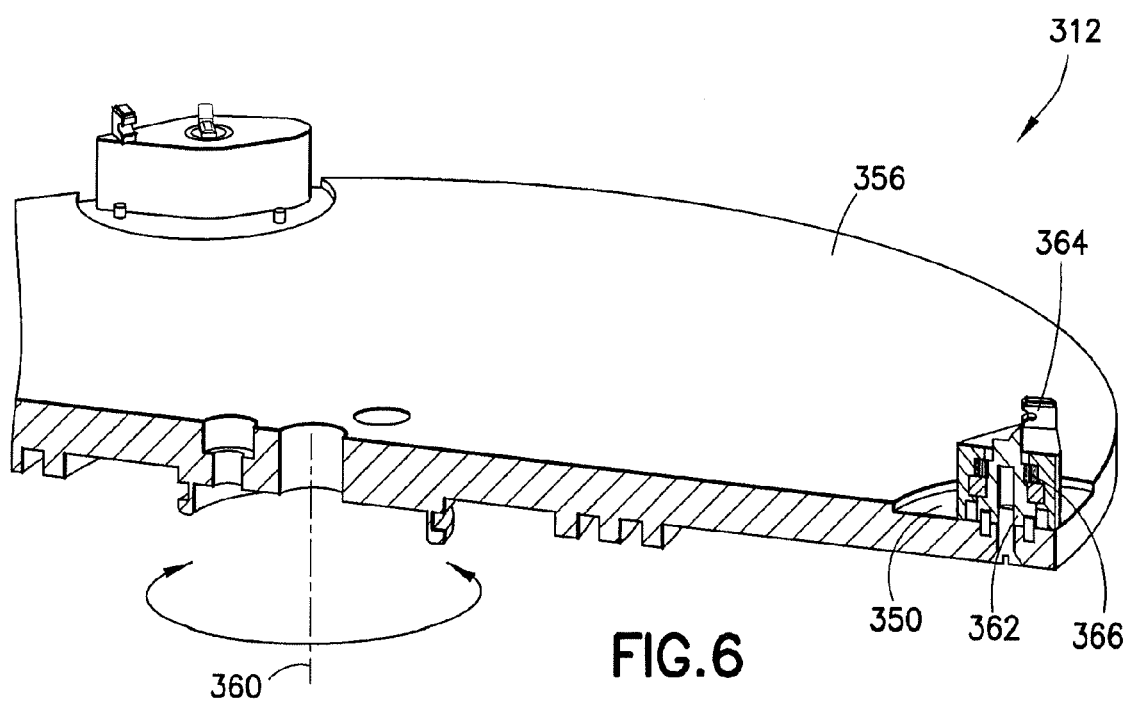
FIG. 6 shows a section view of a rocker arm with spring return chuck.

Referring now to FIG. 5, there is shown a rocker arm with spring return chuck 312. Referring also to FIG. 6, there is shown a section view of a rocker arm with spring return chuck 312. In the disclosed embodiment, chuck 312 may have three clamps 350, 352, 354 provided on a rotary chuck 356. In alternate embodiments, more or less clamps may be provided. Each clamp 350, 352, 354 may be substantially identical and placed at 120 degree intervals to balance rotating chuck portion 356 about axis of rotation 360. As will be shown in greater detail below, exemplary clamp 350 may have vertical center pivot and support post 362 having at the top a wafer support surface and vertical wafer edge backing portion with a lead in surface. Here, pivot 362 may be coupled to the rotating chuck portion 356 with the moveable grip member 364 coupled to the rotating chuck portion 356 on an axis of rotation of pivot 362, where the axis of rotation of pivot 362 may be substantially parallel or aligned with the axis of rotation of chuck 356. Exemplary clamp 350 may have counterweighted edge clamp portion 364 that pivots on the center pivot 362 and having a curved clamp surface that rotates at the critical speed to engage the edge of the wafer 320. Exemplary clamp 350 may have a counter spring 366 that applies a counter rotation torque to the edge clamp portion 364 to pre load the clamp portion 364 in the unclamped position when chuck 312 is stationary and setting the critical speed at which the edge grip portion 364 engages the wafer edge. Two pins may be provided in rotary chuck 356 for each clamp portion to establish stops for each clamp 350, 352 and 354. Further, an optical wafer presence sensor may be provided to detect presence of a wafer in the module. Further, sensors may be provided to detect gripped and released states optionally. For example, optical or proximity switches may be provided to detect a feature(s) and are checked or correlated to the clamp state, for example, three detected clamp or unclamp states per revolution.

In the embodiment shown, the perimeter of substrate 320 is utilized with the edge clamp mechanism 350, 352, 354 uniformly spread along the circumference. By separating the release and grip forces, an inertial clamping motion may be generated by a "rocker arm" type of pivot where the centripetal acceleration is used to apply clamping force at high speed. Here, a spring 366 may be used for centering at zero rotation speed, where the return spring 366 alone or in combination with a pneumatic piston/cylinder may be used for opening clamp 350 and where a similar mechanism may be employed with clamp portions 352, 354. In the chuck 312 shown, features include where each clamp has a single pivot point for an inertial load mechanism and where no pneumatic actuation or bore which would require sealing (i.e. no internal spring) may be required and where the spring force may be adjusted, for example, by using a bent spring fabricated from titanium or otherwise. As will be described, a hard stop closure which can be pins or alternately a feature machined on the main chuck may be provided. In the embodiment shown, a low height profile may be provided, for example, ½" or less, to minimize the mechanism envelope, for example, Z height. As will be described in greater detail below, centripetal force counterweight mechanisms may be used, for example, at 2500 rpm the perimeter of a 300 mm wafer has 2000 G's of acceleration due to non-linear relationships like $A=R*\omega^2$. Countering such forces with springs alone requires minimizing the mass of components free to move, and using fairly strong springs. In operation of a spin rinse dryer, thickness of final water layer, and consequent max residue particle size, requires high speed rotation, and driving chuck 312 capable of high rotation speeds.

Figure 7:
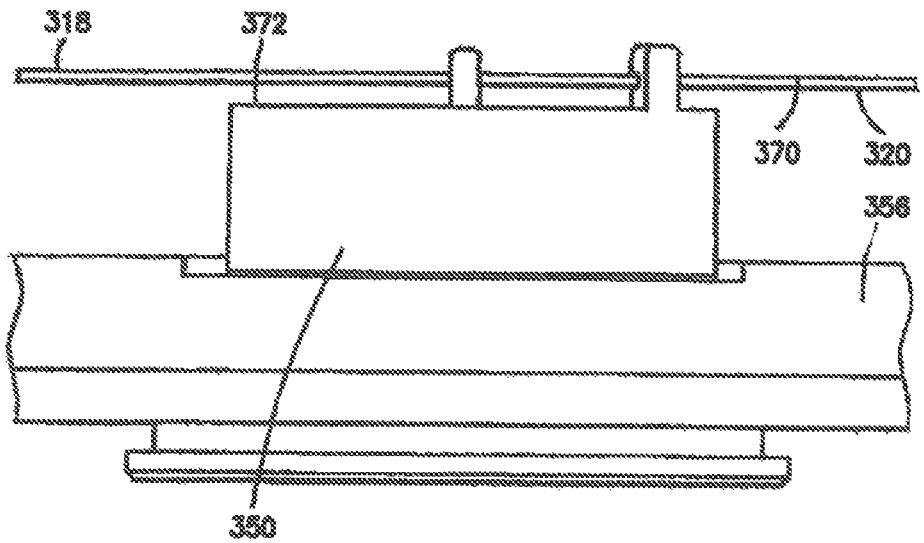
FIG. 7 shows an elevation view of a wafer on a stationary support.
Figure 8:
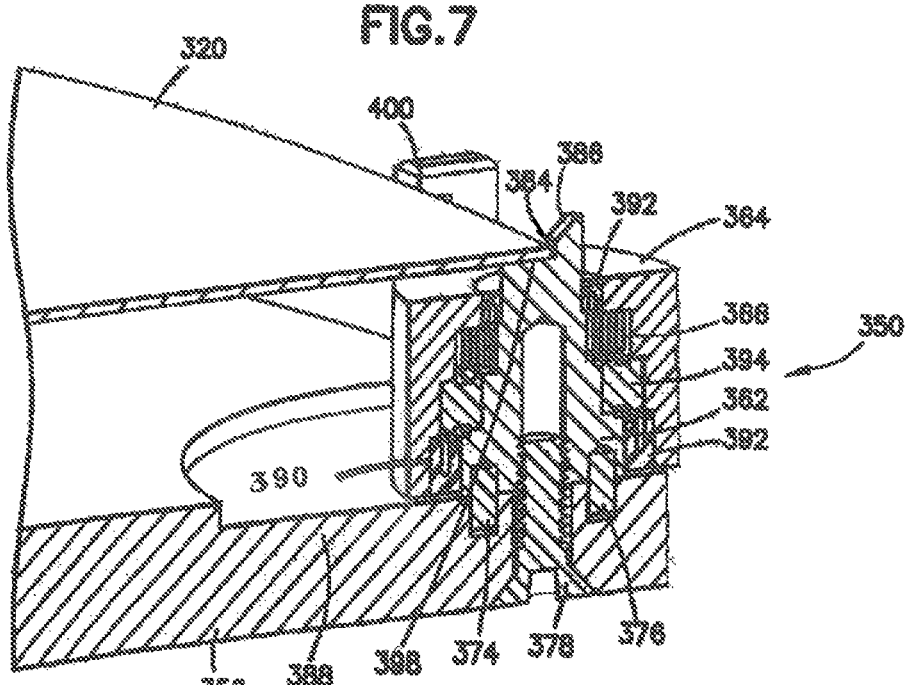
FIG. 8 shows a section view of a wafer on a stationary support.
Figure 9:
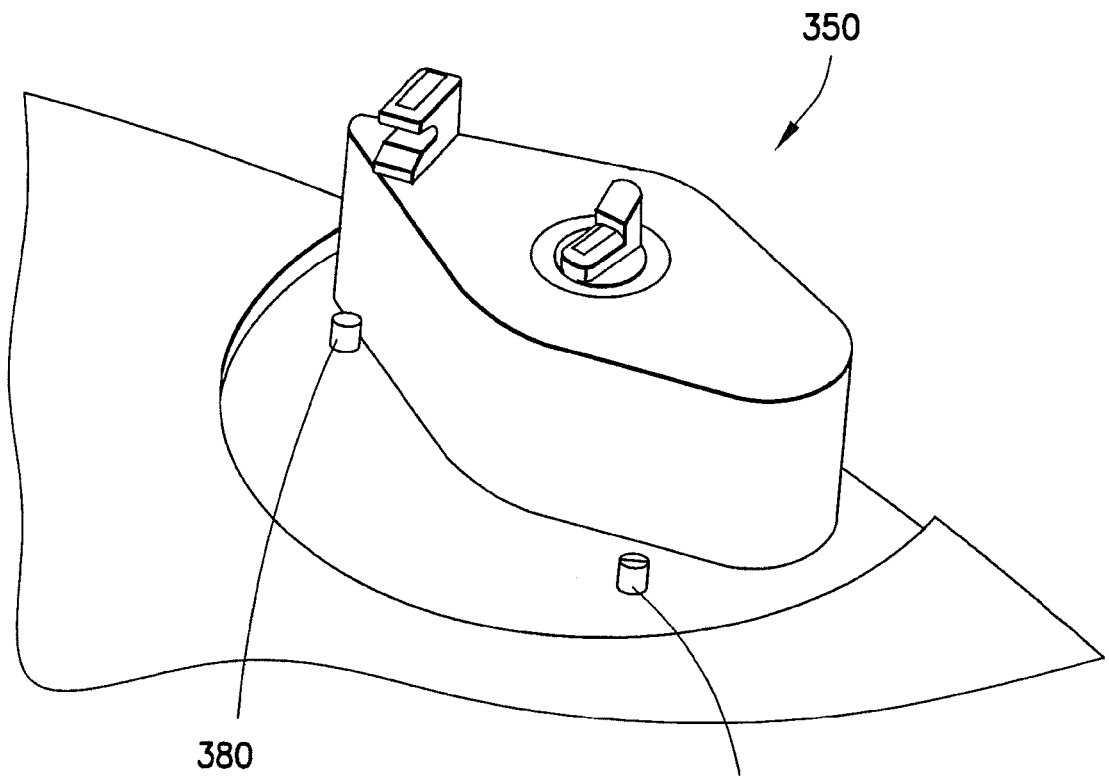
FIG. 9 shows an isometric view of rocker in a clamped position.
Figure 10:
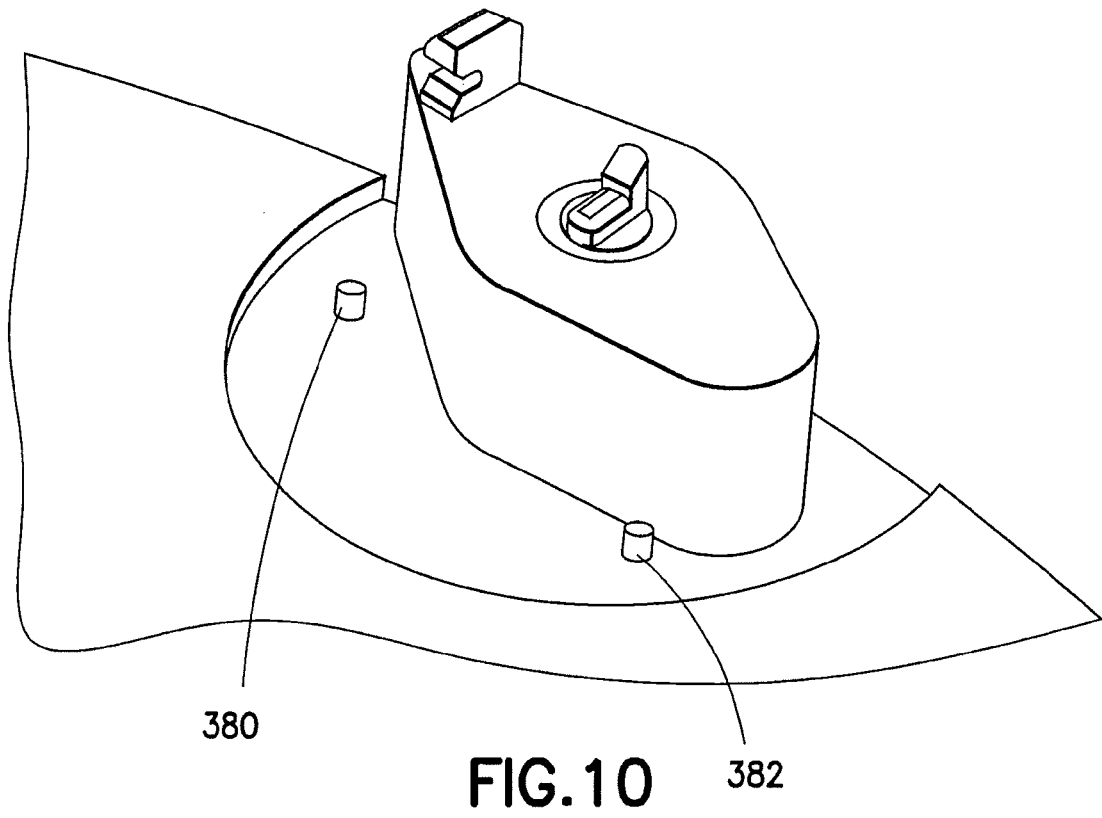
FIG. 10 shows an isometric view of rocker in a clamped position.

Referring now to FIG. 7, there is shown an elevation view of a wafer on a stationary support with clearance between the wafer 320 and the rocker 350. In the embodiment shown, edge grip 350 has a movable grip member 364 movably mounted to rotating chuck portion 356. Here, the moveable grip member 364 may be substantially free moving so that rotation of the rotating chuck portion 356 causes the moveable grip member 364 to move in a plane substantially aligned with a surface 318 of the substrate 320 to engage the substrate 320 in an engaged position as seen in FIG. 8. A resilient element or spring 366 may be coupled to the moveable grip member 364 with the resilient member biasing the grip member to a disengaged position as seen in FIG. 10. Referring also to FIG. 8, there is shown a section view of a wafer on a stationary support with clearance between the wafer 320 and the rocker 350. In the embodiment shown, the wafer 320 may sit 0.566" or otherwise from the surface with a 2 mm or other suitable clearance between wafer bottom 370 and the top of the Rocker assembly 372. Each rocker assembly 350 may attached to the chuck 356 by 2 pressed in 2 mm diameter dowel pins 374, 376 and a M4 threaded flat head screw 378. Referring also to FIG. 9, there is shown an isometric view of rocker 350 in a clamped position and against clamped stop 380. In operation, the wafer edge is engaged prior to engagement with clamped stop 380 where a nominal clearance is provided between the body of clamp 350 and stop 380. Referring also to FIG. 10, there is shown an isometric view of rocker 350 in a un-clamped position against unclamped stop 382. The open and closed position is set by 2 mm dowel pins 380, 382 pressed into the Chuck 356. In the embodiment shown, features that contact the wafer edge are minimized to reduce potential for entrapped DIW and obscuring of the etchant flow. As shown, the contact surfaces for wafer centering have a centering feature 384 with 0.01" nominal radial clearance to the wafer, with a 2 mm radial off-center lead-in on a 45 degree tapered surface 386. As shown, the Z position is defined by a cut 388 from a reference plane in the top surface of chuck 356, but alternately, this recess may not be required, where a flat surface is provided for the top of chuck 356. In the embodiment shown, upper 390 and lower 392 seals isolate bearing 394 and torsion spring 366.

Figure 11:
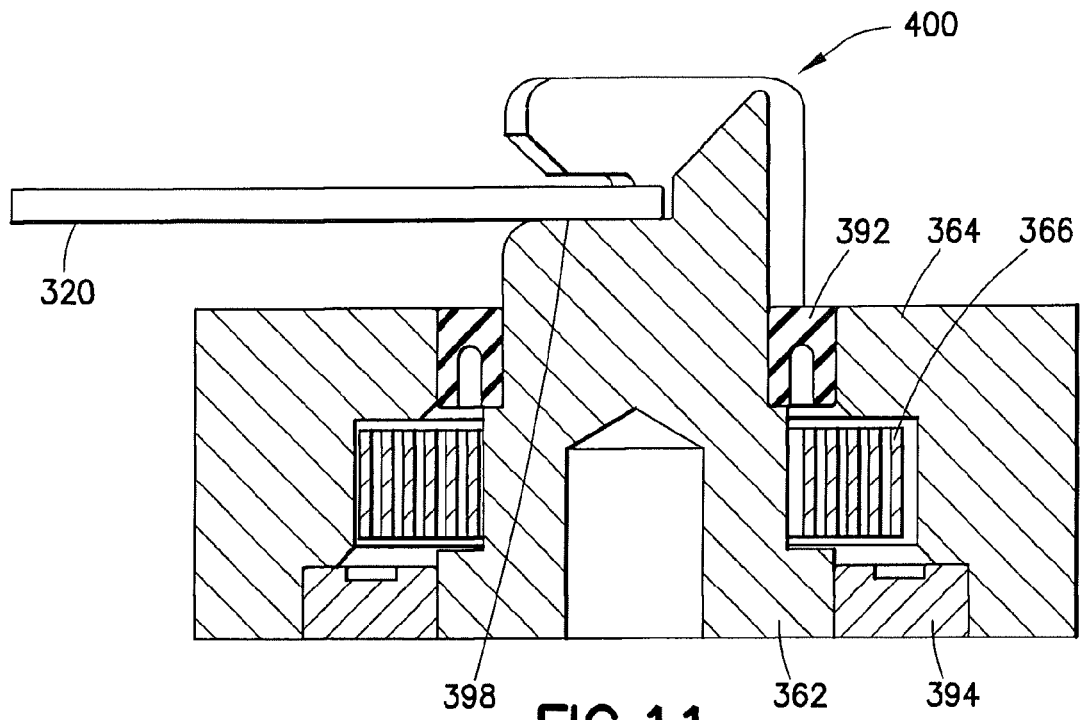
FIG. 11 shows a section view through an axle.
Figure 12:
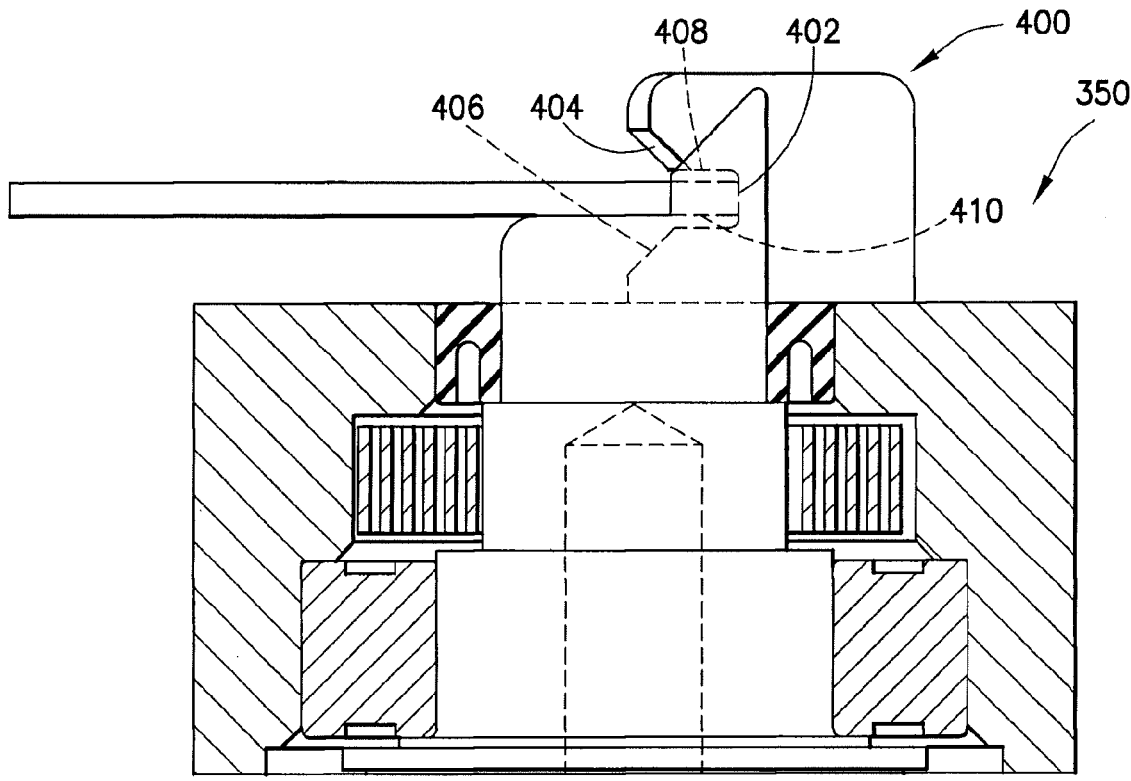
FIG. 12 shows a section view of a rocker.

In the embodiment shown, edge grip feature 350 is shown on rotary chuck 356 with the edge grip feature 350 having pivot 362 offset from and substantially parallel to an axis of rotation 360 of the rotary chuck 356 and with substrate supporting surface 398. Here, counter weighted edge clamp portion 364 pivots on pivot 362 where counter spring 366 applies a counter torque to the counter weighted edge clamp portion 364 and where the edge clamp portion 364 overcomes the counter spring 366 and engages an edge of the substrate 320 upon the rotary chuck 356 exceeding a predetermined angular velocity. The edge clamp portion 364 disengages the edge when the rotary chuck 356 is stationary. In the embodiment shown, the pivot 362 and the substrate supporting surface 398 are of unitary construction where pivot 362 has a lead in portion 386. In the embodiment shown, substrate holder 312 has three edge grip features 350, 352, 354, where the three edge grip features center the substrate on a substrate axis of rotation substantially concentric with the axis of rotation 360 of the rotary chuck 312 upon the rotary chuck exceeding the predetermined angular velocity. Here, first stop 382 is adapted to limit rotation of the edge clamp portion 350 in a disengaged position and a second stop 380 is adapted to limit rotation of the edge clamp portion 350 in an engaged over travel position and where the spring 366 biases the edge clamp portion toward the disengaged position. The edge grip feature 364 has a capture portion 400 adapted to retain the substrate in an axial direction with respect to the axis of rotation when the edge clamp portion 364 engages the edge of the substrate. As shown, seal(s) 390 are shown between the pivot 362 and the counter weighted edge clamp portion 364. As shown, seal(s) 392 are shown between the pivot 362 and the counter weighted edge clamp portion 364 as the counter weighted edge clamp portion 364 pivots on the pivot 362 where the seal(s) 390 and 392 isolate the bearing 394 and the counter spring 366 from the substrate 320. In the embodiment shown, bearing 394 may be a ball bearing, roller bearing or otherwise. In alternate embodiments, bearing 394 may be a bushing, flexure bearing or any suitable bearing. Referring also to FIG. 11, there is shown a section view through an axle in an edge close-up with wafer in on-center position. Referring also to FIG. 12, there is shown a section view of a rocker 350. Capture portion 400 of counter weighted edge clamp portion 364 is shown having a contact point 402, lead in portions 404, 406 and upper 408 and lower 410 surfaces where clearance is provided between wafer 320 and upper 408 and lower 410 surfaces during normal operation where contact occurs at portion 402 during wafer clamping and where surface 408 may be a capture portion that prevents axial movement of wafer 320 with respect to axis 360 for example. Here, a cross section is shown with the Rocker capture structure and axle 364 with an edge close-up with wafer 320 in an on-center position. In the embodiment shown, the rocker has 0.25 mm clearance at surfaces 408, 410 to 0.75 mm thick wafer bottom and top relative to the Axle surface 398 on which Wafer sits. Radial lead-in surfaces 404, 406 are shown on the Rocker at 45 degrees with a 1 mm opening top and bottom relative to this 1.25 mm slot. In alternate embodiments, any suitable geometry may be used. The rocker assembly 350 may use coil spring 366 or alternately may utilize a hairspring (shorter axial length) or otherwise be preloaded. A common part may be used for the rocker 364 and axle 362, using different configurations, for example, so that alignment of seals and bearings is easier, driving them off reference planes. In the embodiment shown, a substrate holder has rotary chuck 356 having a seat 398 for supporting the substrate 320 where inertially actuated edge grip 364 is movably mounted to rotary chuck 356 with inertially actuated edge grip 364 (350) having a substrate contact member 400 movable relative to the rotary chuck 356 for effecting edge grip clamping of the substrate 320. Here, substrate contact member 400 is configured so that movement of the substrate contact member 400 to contact the substrate 320 is in a plane substantially orthogonal to an axis of rotation 360 of rotary chuck 356 where the movement of substrate contact member 400 to contact substrate 320 is effected by inertia effects generated by rotation of rotary chuck 356 about the axis of rotation 360 at a predetermined angular velocity.

Figure 14:
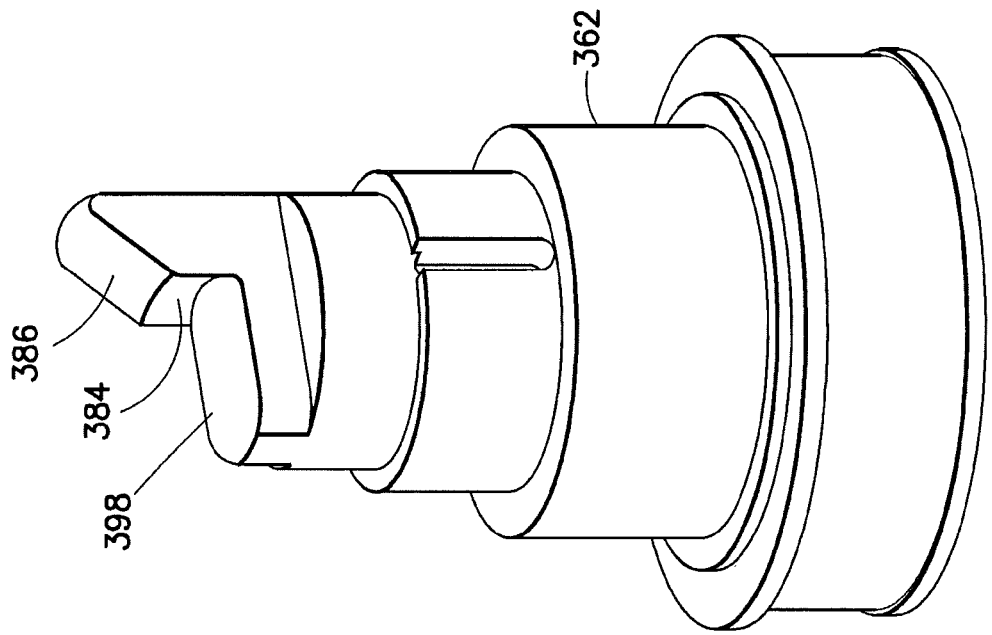
FIG. 14 shows an isometric view of an axle with wafer support.
Figure 13:
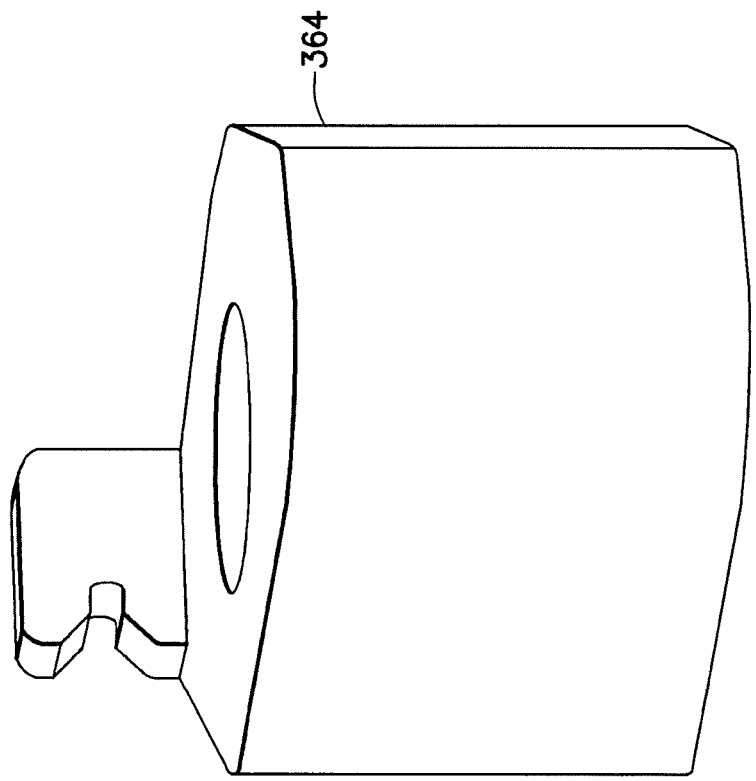
FIG. 13 shows an isometric view of a rocker.
Figure 15:
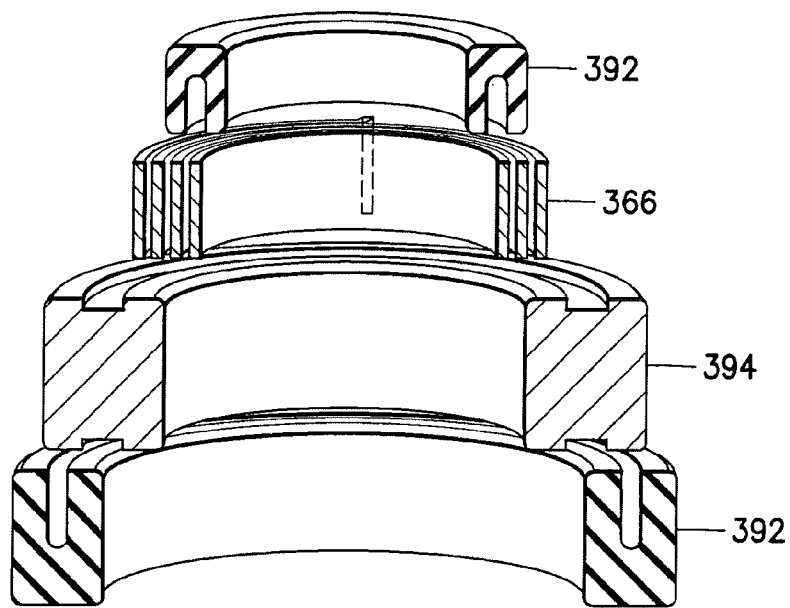
FIG. 15 shows a partial view of components internal to a rocker assembly.

Referring now to FIG. 13, there is shown an isometric view of rocker 364. Referring also to FIG. 14, there is shown an isometric view of an axle with wafer support 398 and lead in features 386, 384. Referring also to FIG. 15, there is shown a partial view of components internal to a rocker assembly 350 showing upper seal 390, torsion spring 366, bearing 394 and lower seal 392.

Figure 16:
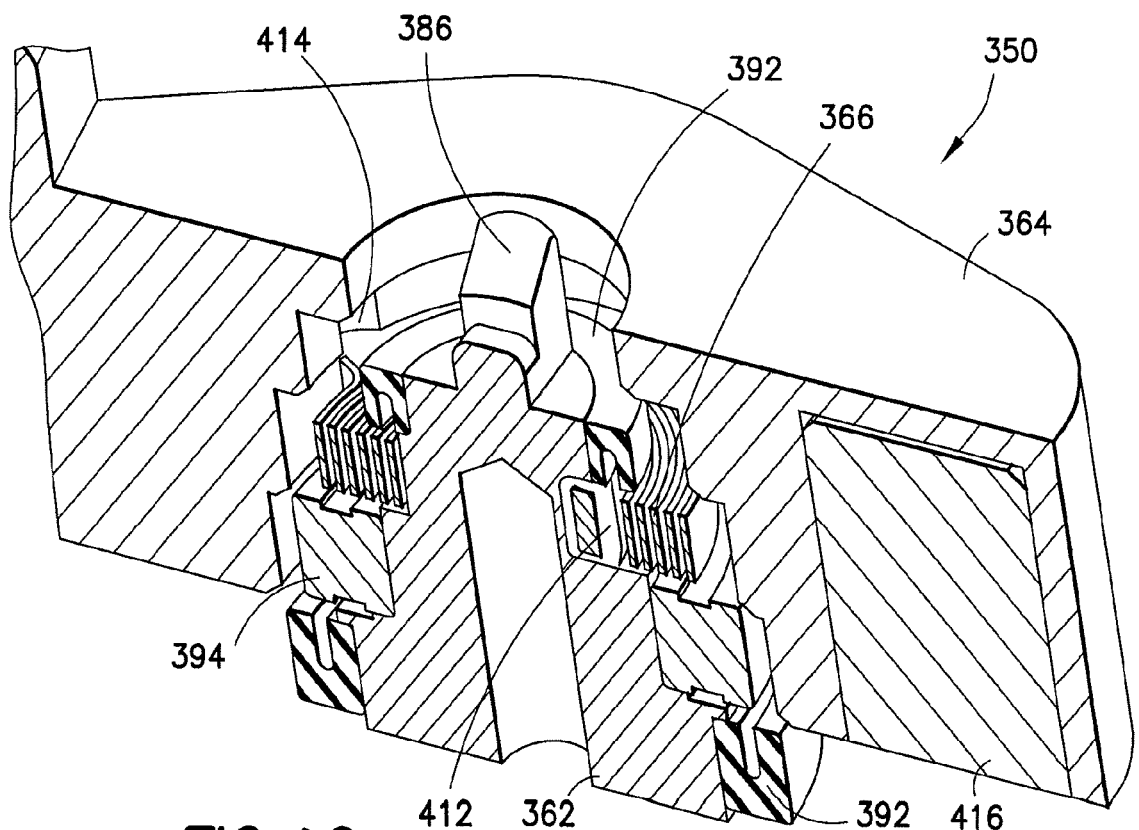
FIG. 16 shows a rocker and axle section with rocker offset.
Figure 17:
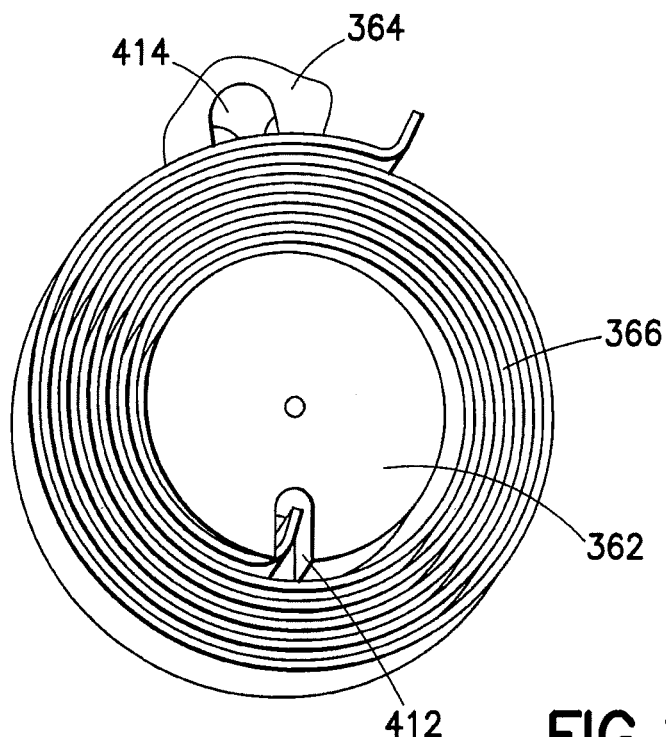
FIG. 17 shows a torsion spring.

Referring now to FIG. 16, there is shown a rocker and axle section with rocker offset. In the embodiment shown, seals 392, bearing 394 and spring 366 are shown in position on pivot about axle 362 with rocker 364 offset axially with respect to axle 362. Counterweight 416 is shown pressed into rocker 364. Here, counter weighted edge clamp portion 364 has a substrate edge engagement side and a counter weighted side having counterweight 416 disposed opposite the pivot axis with respect to the edge clamping side. Here, the counter weighted edge clamp portion 364 has a center of mass disposed between the pivot axis and the counter weighted side. Referring also to FIG. 17, there is shown torsion spring 366 mounted between rocker 364 and axle 362 where torsion spring 366 is shown in first 412 and second 414 engagement slots. The engagement slots are positioned to preload the rocker 364 in an open position with a predetermined preload torque that is overcome by centripetal force acting on the combination of counterweight 416 and rocker 364 and the stiction associated with seals 392. The stiction in seals 392 may provide a predetermined hysteresis, for example, where edge clamping may require exceeding a higher angular velocity of the chuck than unclamping. In the embodiment shown, both rocker 364 and axle 362 may be turned then milled to provide precision diameters which may be needed to ensure that presses onto bearing 394 hold the pair together and that the fits on the seals 392 provide a reproducible amount of torsional stiction and sealing. Axle 362 may have a subsequent milling operation to define the wafer lead-in feature 386 and a 1/32" ball milled slot 412 from the side for capturing the inner end of hairspring 366. Rocker 364 may have a 0.04" slot for wafer capture milled along with some chamfering and filleting to minimize water capture in the top region. In alternate embodiments, any suitable geometry may be provided. The assembly may be made by pressing components onto the axle 362 and using a slip press for the rocker 364 over the bearing 394; seals 392 have a tight fit onto axle 362 and rotate against the surface of the bores of rocker 364. Assembly 350 may be as follows. The lower seal 392 is pressed from bottom over a 0.005" radial boss. The bearing 394 is pressed from the top against a stop surface on Axle 362. The hairspring 366 is then put in place, with tab inserted into the ⅟₃₂" ball milled radial slot 412 and the top seal 390 pushed over axle 362. The rocker 364 is then pushed on from the top, engaging hairspring rotational capture slot 414 after the bearing press surface starts to engage requiring rotational alignment correct before pushing down axially. A ⅟₃₂" thick skin (not shown) may be provided in the Rocker over the top seal or the top surface of Rocker may be provided flat, as shown, to ensure best fluid escape.

Figure 18:
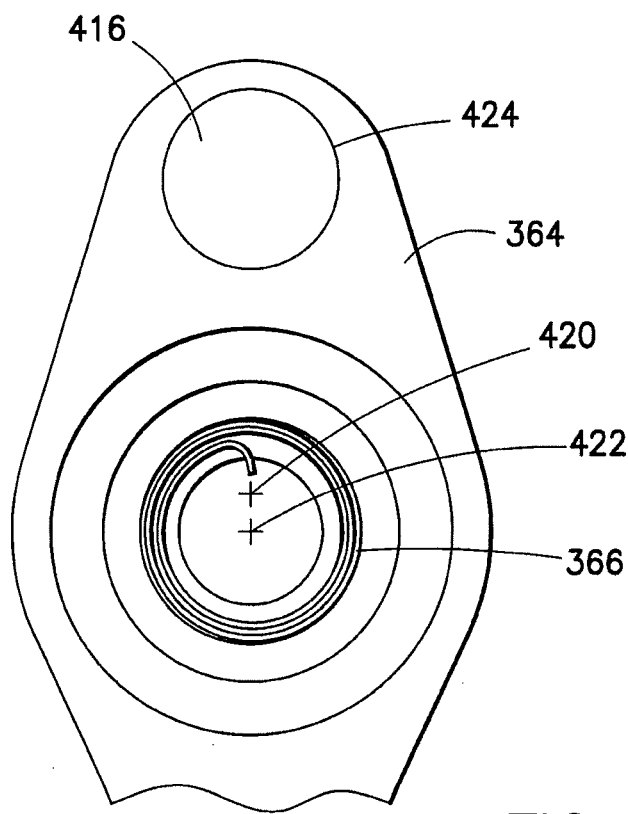
FIG. 18 shows a weight in a rocker.

Referring now to FIG. 18, there is shown a weight 416 pressed in rocker 364 with spring 366. Weight 416 may be fabricated from stainless steel, tungsten or otherwise and may be pressed in the rocker 364 as shown. In the exemplary embodiment, the center of gravity 420 is shown 0.24" from the axis 422 of axle 362 using a single ⁵⁄₁₆" diameter ½" long SS weight 416 that is pressed into hole 424 where the difference between open and close positions may require a 15 degree rotation of rocker 364. In alternate embodiments, any suitable geometry may be provided, for example, with rocker 364 being of unitary construction with different mass properties. Here, the exemplary hairspring 366 shown may be defined with 0.01" thick by 0.1" tall stainless spring steel; 5.5 turns on 0.02" pitch where the envelope may be provided large enough to accommodate optimization of thickness, pitch, and number of turns. In alternate embodiments, any suitable spring torque/counter torque device may be provided. In the embodiment shown, a rocker-arm weighted with SS gripped wafer at 720 rpm whereas a rocker-arm weighted with tungsten and copper gripped wafer at 490 rpm. In alternate embodiments, any suitable speed may be provided. Spring force may be between 0.3-0.4 lbs. or otherwise.

Figure 20:
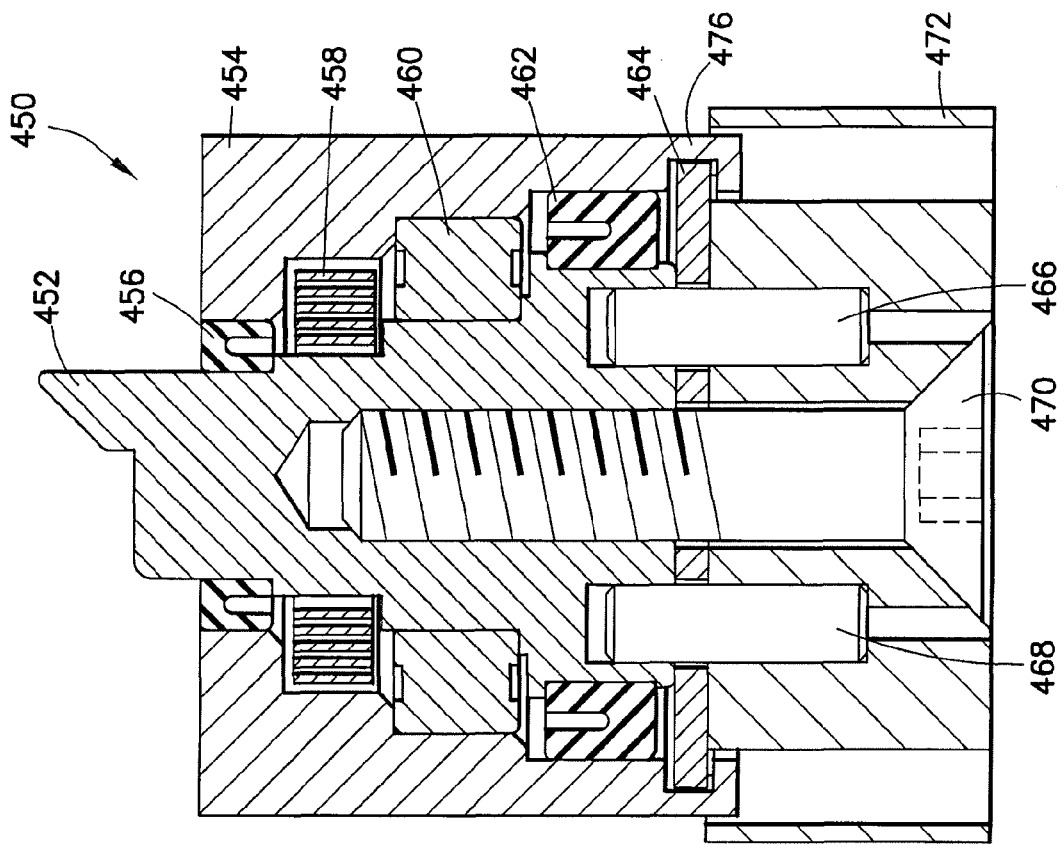
FIG. 20 shows a section view of a rocker assembly.
Figure 19:
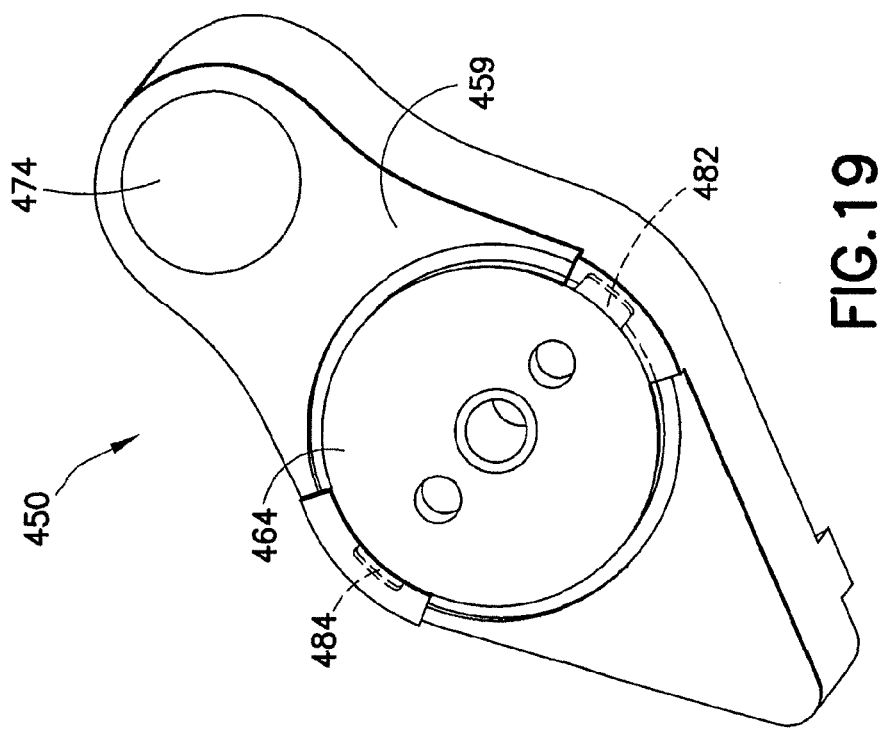
FIG. 19 shows an isometric view of a rocker.
Figure 21:
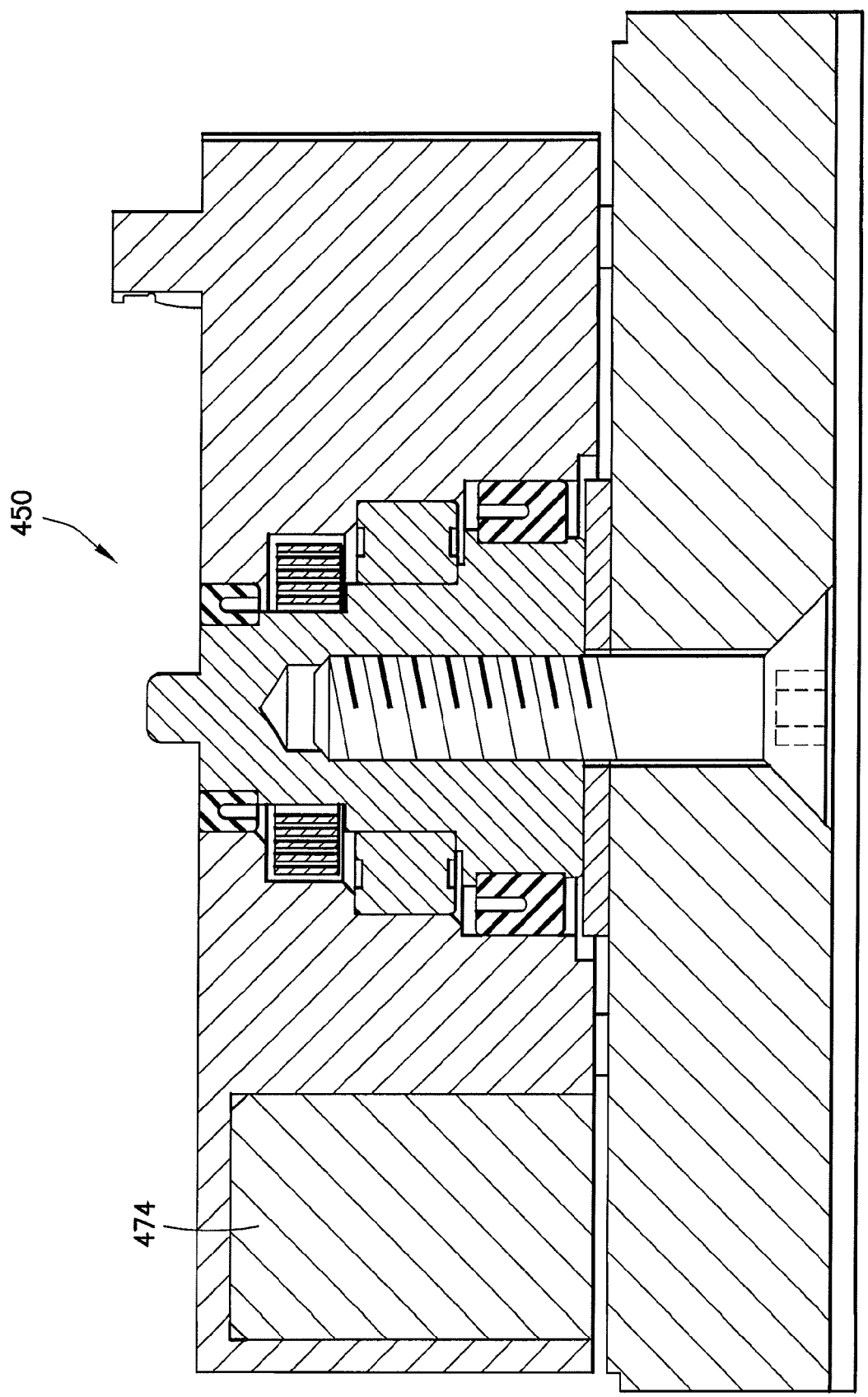
FIG. 21 shows a section view of a rocker assembly.
Figure 22:
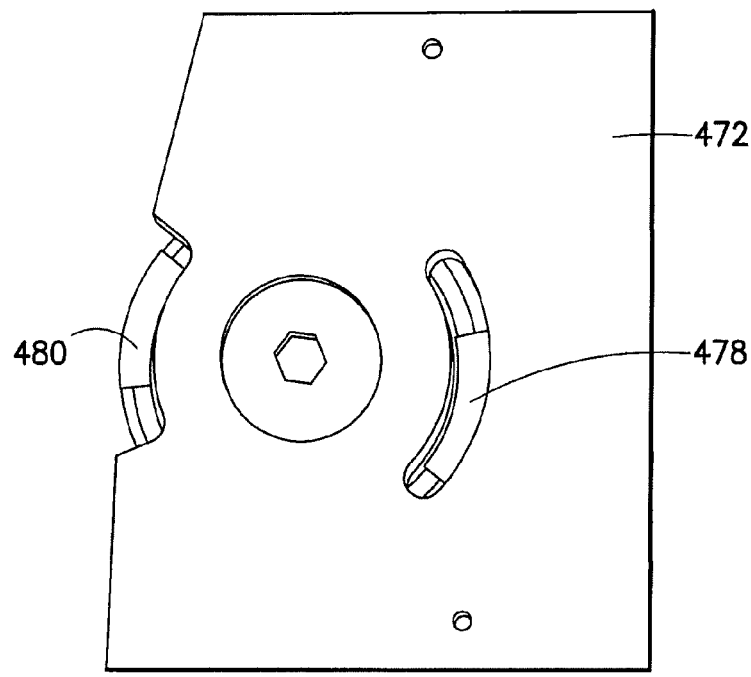
FIG. 22 shows a portion of a chuck underside.

Referring now to FIG. 19, there is shown an isometric view of an alternate embodiment rocker 450. Referring also to FIG. 20, there is shown a section view of rocker assembly 450. Referring also to FIG. 21, there is shown a section view of rocker assembly 450. Rocker assembly 450 has axle 452, rocker 454, upper seal 456, torque spring 458, bearing 460, lower seal 462 and retaining plate 464. Pins 466, 468 and cap screw 470 positively locate and fasten clamp 450 to chuck 472. In the embodiment shown, clamp 350 supported 300.5 mm clearance, clamp 450 may support 300.25 mm clearance and mass of weight pin may be increased by 65% or otherwise. Further, clamp may increase the distance of weight pin 474 from rocker axle center from 0.595 to 0.765" where the center of mass along the Z-axis may change from 4.1 mm to 6.7 mm. In addition, features are provided to restrain the Rocker-arm from tipping away from center of wafer as an additional piece 464 acts like a retaining ring against the rocker-arm 454 where a machined slot feature 476 is provided for the retainer 464 and rocker-arm 454 to clear. As can be seen in FIG. 22, chuck 472 may have machined slot features 478, 480 for the retainer and rocker-arm to clear. As can be seen in FIG. 19, retainer 464 may have two tabs 482, 484 shown outlined which are located and mounted via pins 466, 468 and held in place by the threaded fastener 470. The angular slot 476 in the rocker-arm 454 may be provided to account for rocker-arm rotation while remaining engaged in retainer 464. Because of the retainer and corresponding slot in rocker-arm, the chuck may be slotted to provide clearance for these features. In the embodiment shown, the retainer 464 clears slots 478, 480 that go through the thickness of the chuck because of the concern for fluid collection. As can be seen in FIG. 22, the chuck underside is shown where slots 478, 480 in the chuck allow for sufficient clearance with rocker-arm 450 so as not to affect closing/opening rpm. To maintain the existing elevation to wafer load/unload the chuck boss may be lowered by the thickness of the retainer, 0.040". In alternate embodiments, any suitable features, materials or geometry may be provided.

Figure 23:
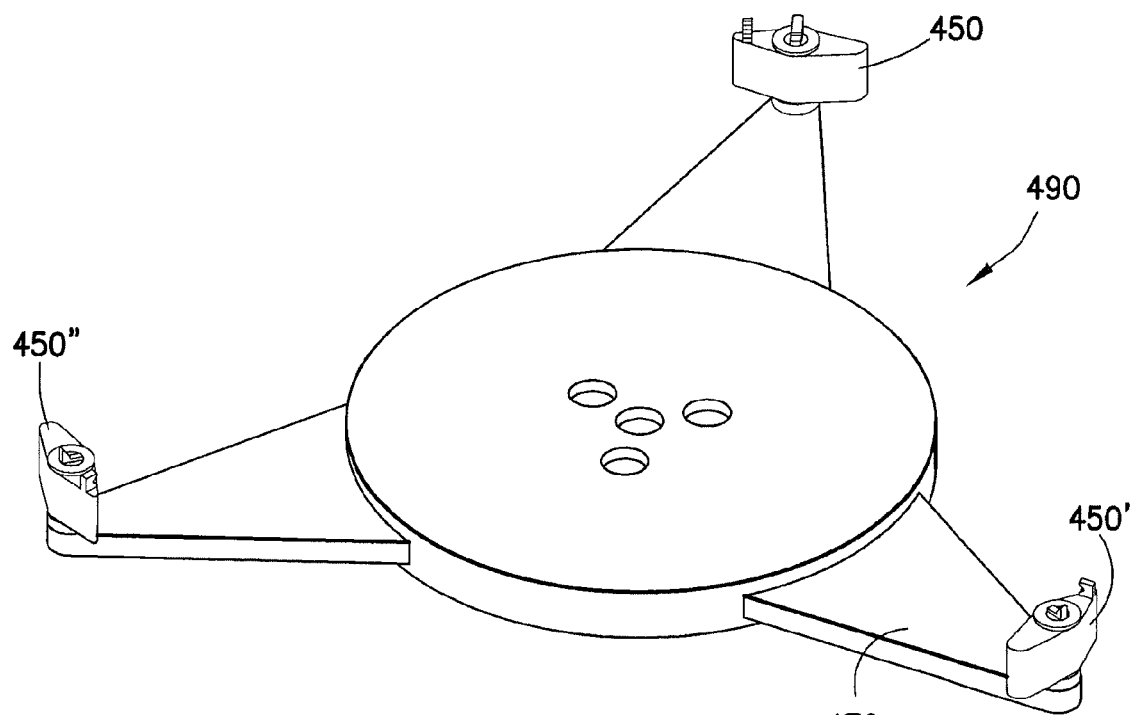
FIG. 23 shows an isometric view of a chuck.
Figures 24, 25:
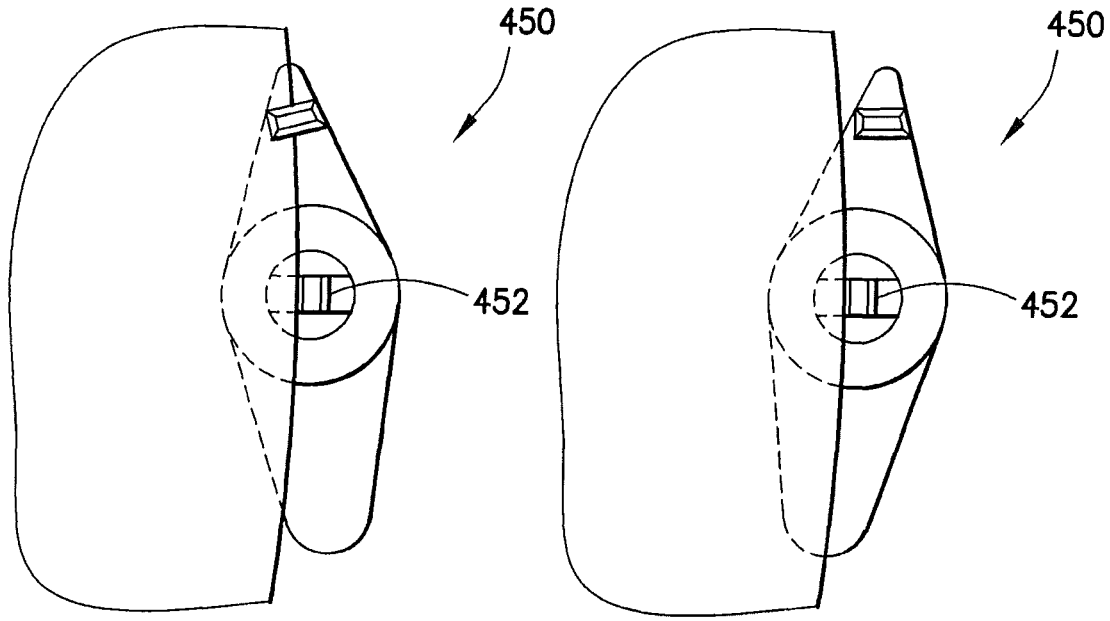
FIG. 24 shows a rocker in a clamped position.
FIG. 25 shows a rocker in an unclamped position.

Referring now to FIG. 23, there is shown an isometric view of a chuck 490 with three rockers 450, 450' and 450". In the embodiment shown, three or four point edge and bottom contact to the Wafer is supported on the Axle and the Rocker is closed onto the Wafer by centripetal force and opened away from the Wafer by a coil spring that is pre-loaded appropriately to cause Rockers to open below a certain RPM, for example about 10% faster than the RPM used for Etch step. A capture-feature on the Rocker engages the wafer edge; as shown here it is narrow—rather than aerodynamic—in order to minimize interference with drying the wafer edge. In the embodiment shown, the orientation of rockers 450, 450', 450" i.e. rotating around axis parallel to wafer axis provides for improved aerodynamics at higher speed. The aerodynamic shape for the Rocker is used to minimize drag and turbulence, for example, at 3000 RPM the relative tangential air velocity is approximately 150 ft./sec or 90 mph. In alternate embodiments, adjustment of the tail, weight, or end of the Rocker may be provided, for example, in the closed position the aerodynamic force may push the rocker closed. Alternately, as the centripetal force is going up as square of rotation speed, such tuning may not be required. In the embodiment shown, three rockers 450, 450', 450" may be positioned for 300 mm and may have an exemplary inertia of 1.45 lb-in^2, which is about ⅓ of the 300 mm by 0.75 mm thick wafer inertia of 4.74 lb-in^2. The exemplary chuck body 472 shown may have inertia of 11.76 lb-in^2, or otherwise. In alternate embodiments, any suitable mass properties may be provided. Referring also to FIG. 24, there is shown rocker 450 in a clamped position. Referring also to FIG. 25, there is shown a rocker in an unclamped position.

Figure 26:
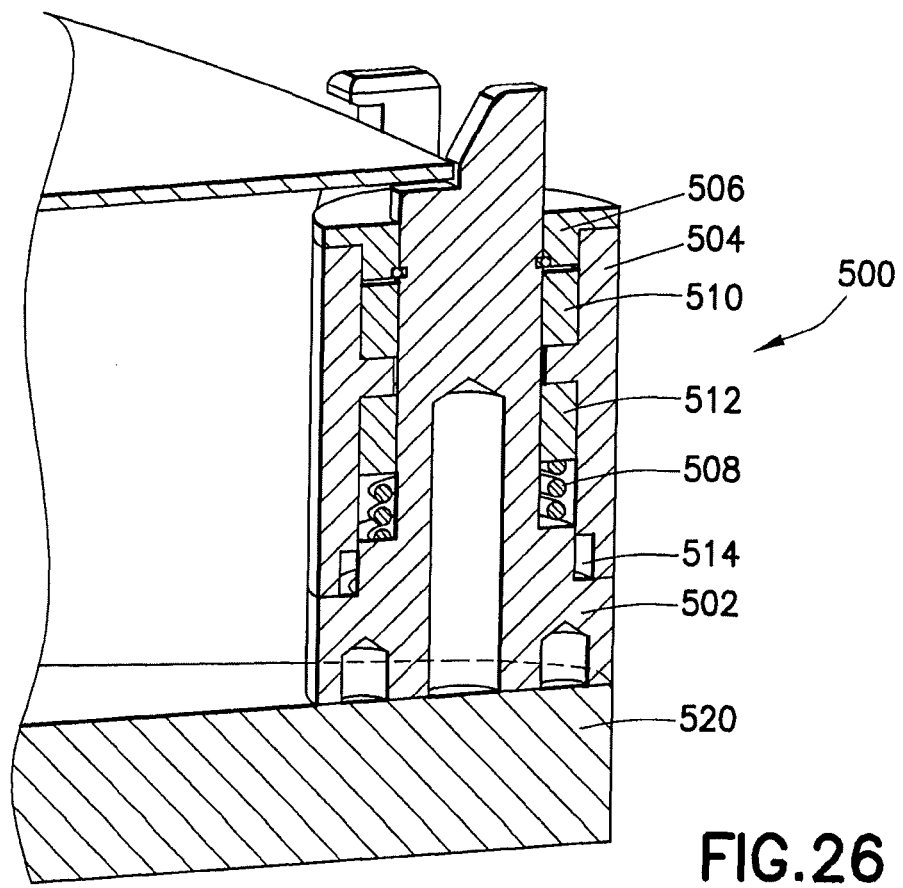
FIG. 26 shows a section of a wafer unclamped.
Figure 28:
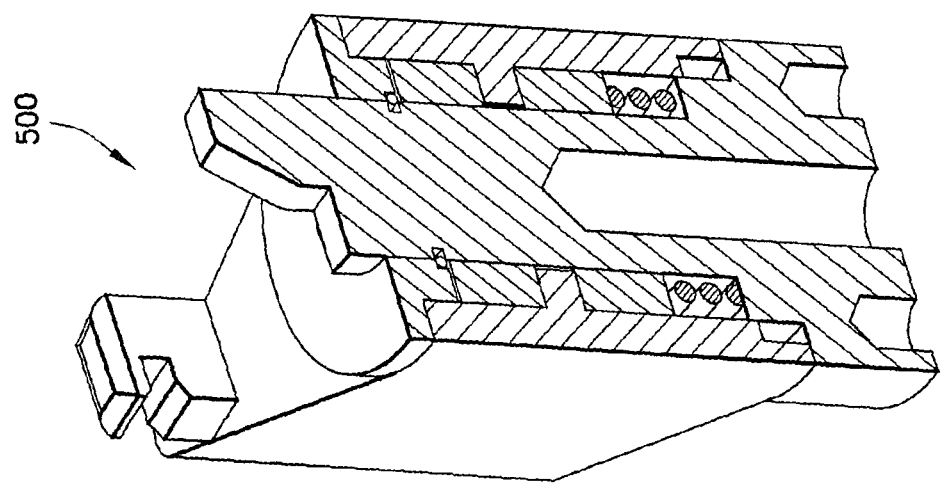
FIG. 28 shows a section of a rocker.
Figure 27:
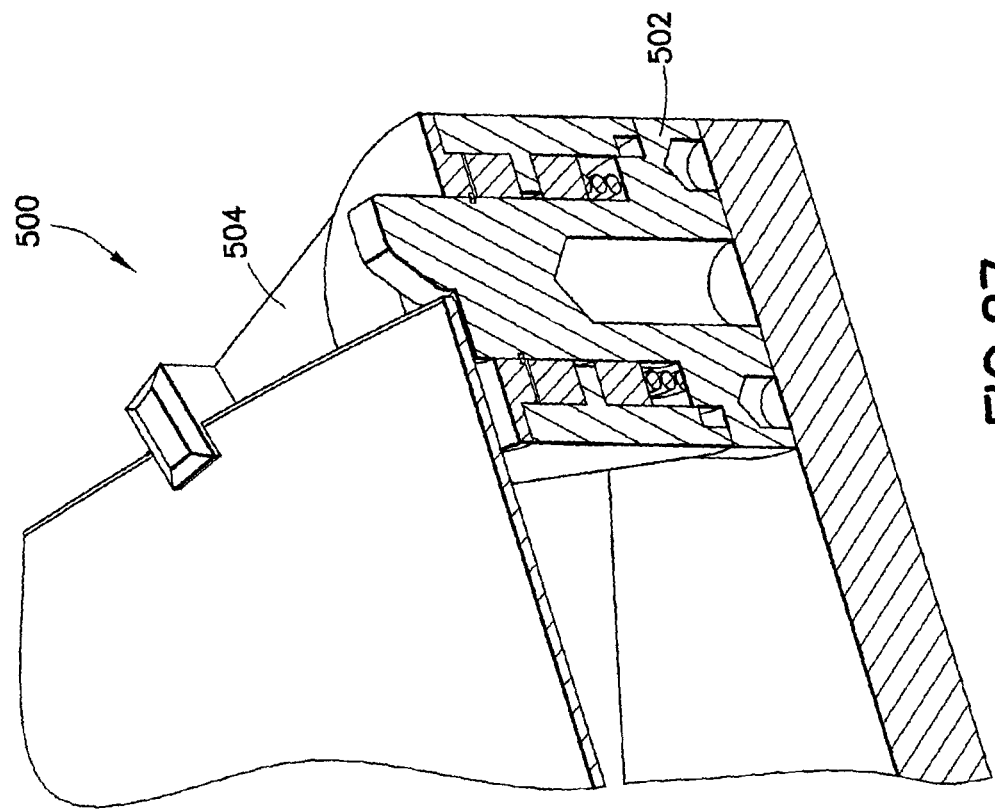
FIG. 27 shows a section of a wafer clamped.
Figure 29:
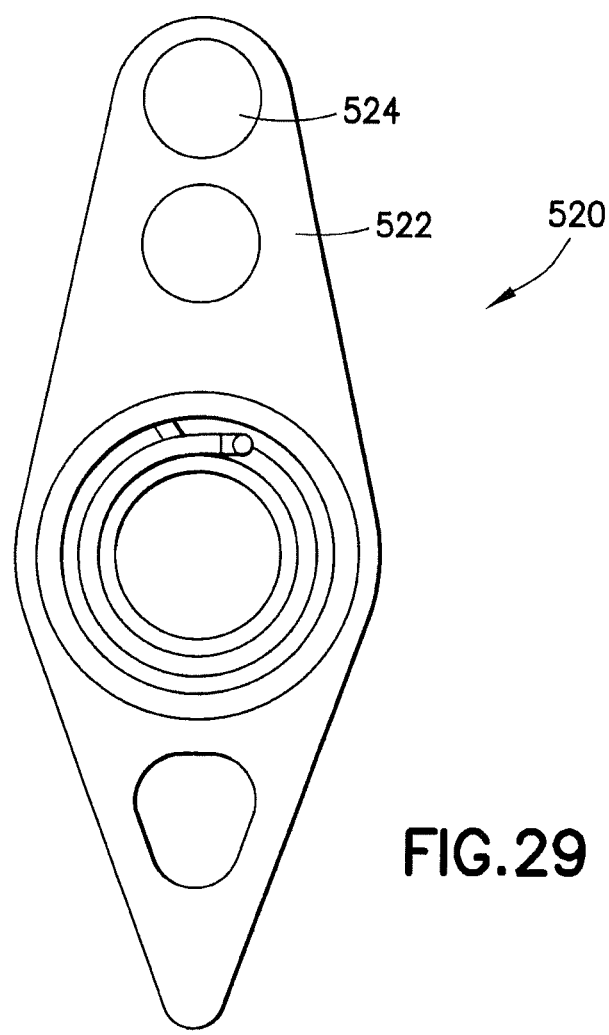
FIG. 29 shows a rocker bottom view.
Figure 30:
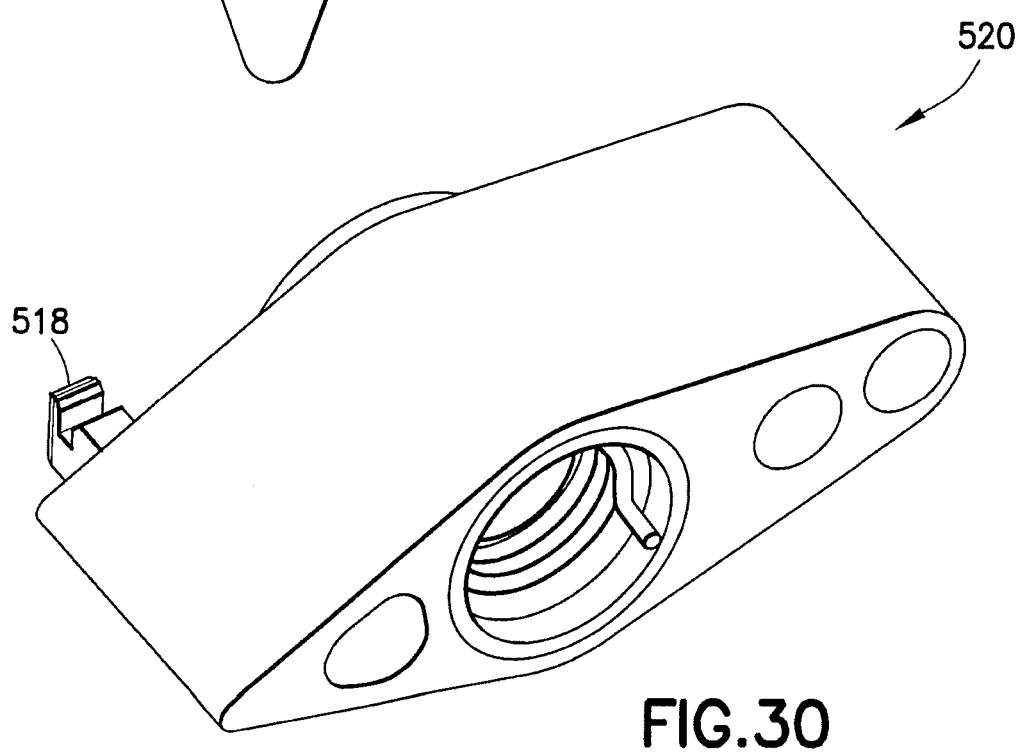
FIG. 30 shows a rocker isometric view.

Referring now to FIG. 26, there is shown a section of an alternate embodiment rocker 500 with a wafer unclamped. Referring also to FIG. 27, there is shown a section of rocker 500 with a wafer clamped. Referring also to FIG. 28, there is shown a section of rocker 500 with no wafer. Rocker assembly 500 has axle 502, rocker 504, upper seal 506, torque spring 508, bearings 510, 512 and lower seal 514. Pins and a cap screw may be provided to positively locate and fasten clamp 500 to chuck 520. In the embodiment shown, the wafer is centered by a lead-in feature on the axle 502, and the wafer is supported by 3 point contact with additional rockers. In alternate embodiments, 4 or more support features or rockers may be provided. In the embodiment shown, a 30 degree lead-in angle may be used with a 1.2 mm off center capture window. In alternate embodiments, other angles or capture windows may be provided, for example, to provide more capture window if a larger vertical motion is used on the pick and place. In the embodiment shown, a pair of bearings may be light pressed into the Rocker 504 held in place by a spring-clip or otherwise with the cavity sealed with one or more pressed in PTFE lip seal(s). In the embodiment shown, rocker 504 may be fabricated from PEEK or other suitable material to provide required strength and machinability. Coil spring 508 may be used to provide return force at zero RPM to open the Rocker 504 for load/unload, for example, a stainless steel spring may be provided to open the Rocker at below 100 RPM or otherwise. A rotational stop feature may be provided to define the open and closed positions. In alternate embodiments, more or less features may be provided. Referring also to FIG. 29, there is shown rocker 500 bottom view. Referring also to FIG. 30, there is shown rocker 500 isometric view. In the embodiment shown, capture feature 518 may be provided, for example as a V-shape where the V-centerline is aligned to wafer radius as the Rocker encounters the wafer. In the embodiment shown, a pair of 3/16" SS pins 522, 524 may pressed into the Rocker to shift the center of mass away from center of rotation, and a small amount of light weighting may be milled into the front section of Rocker 504. Coil spring 508 may be aligned to Rocker 504 by a radial tab, it is aligned to Axle 502 by an axial tab. In the embodiment shown, inertial torque due to the rocker arm may be about 0.15 in-lbs. at 100 rpm, indicating the rocker-arm may close on the wafer at just under 100 rpm with some margin of safety. In alternate embodiments, any suitable predetermined speed(s) or mass properties may be provided.

Figure 31:
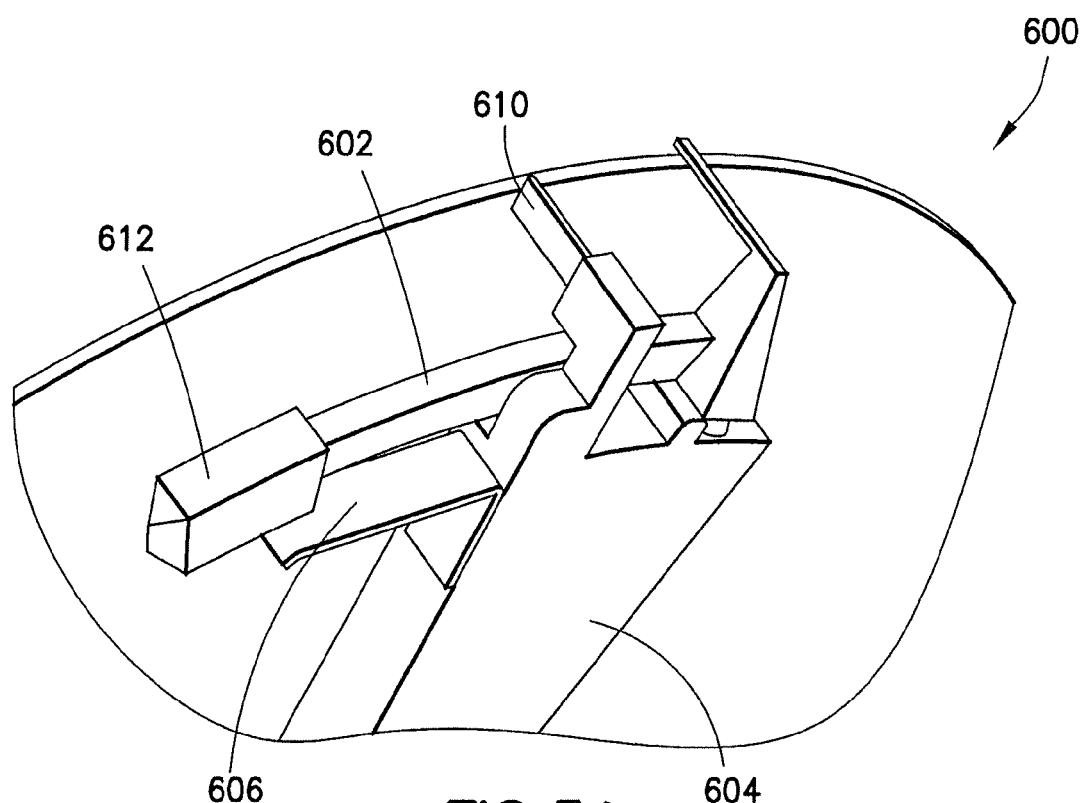
FIG. 31 shows a chuck in a clamped position.
Figure 32:
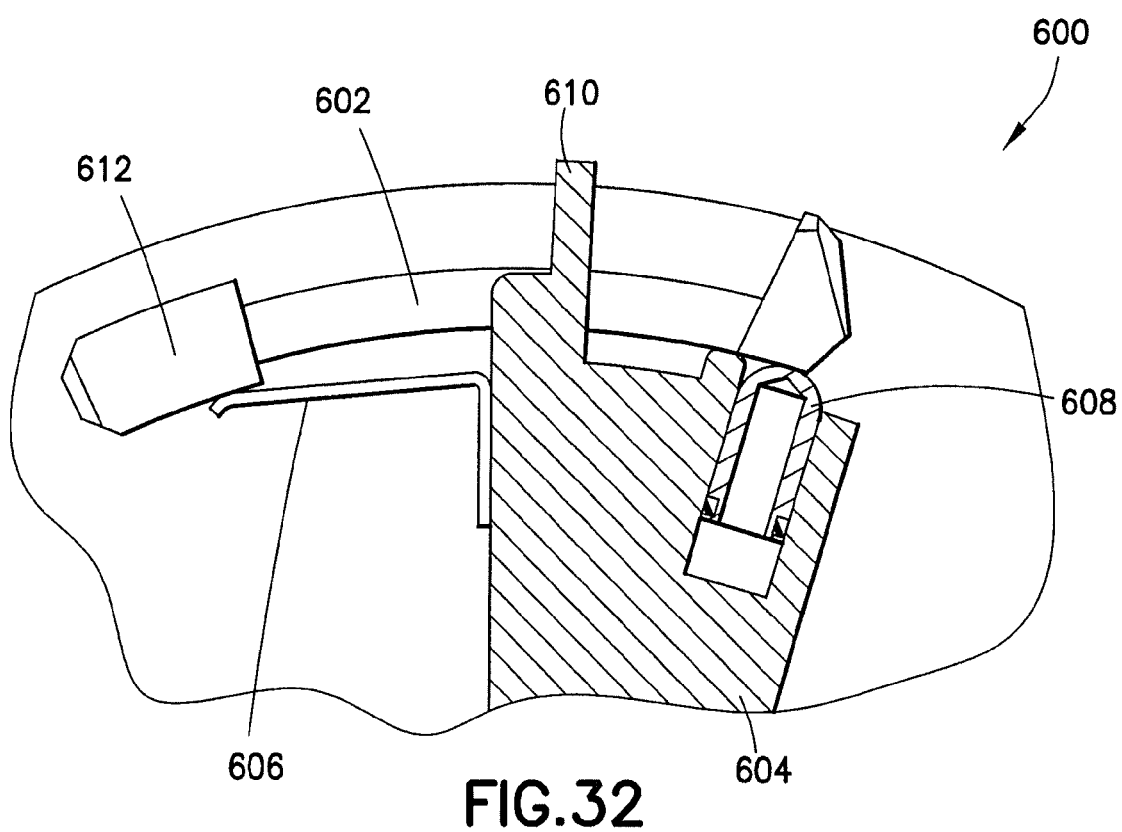
FIG. 32 shows a chuck in a clamped position.
Figure 33:
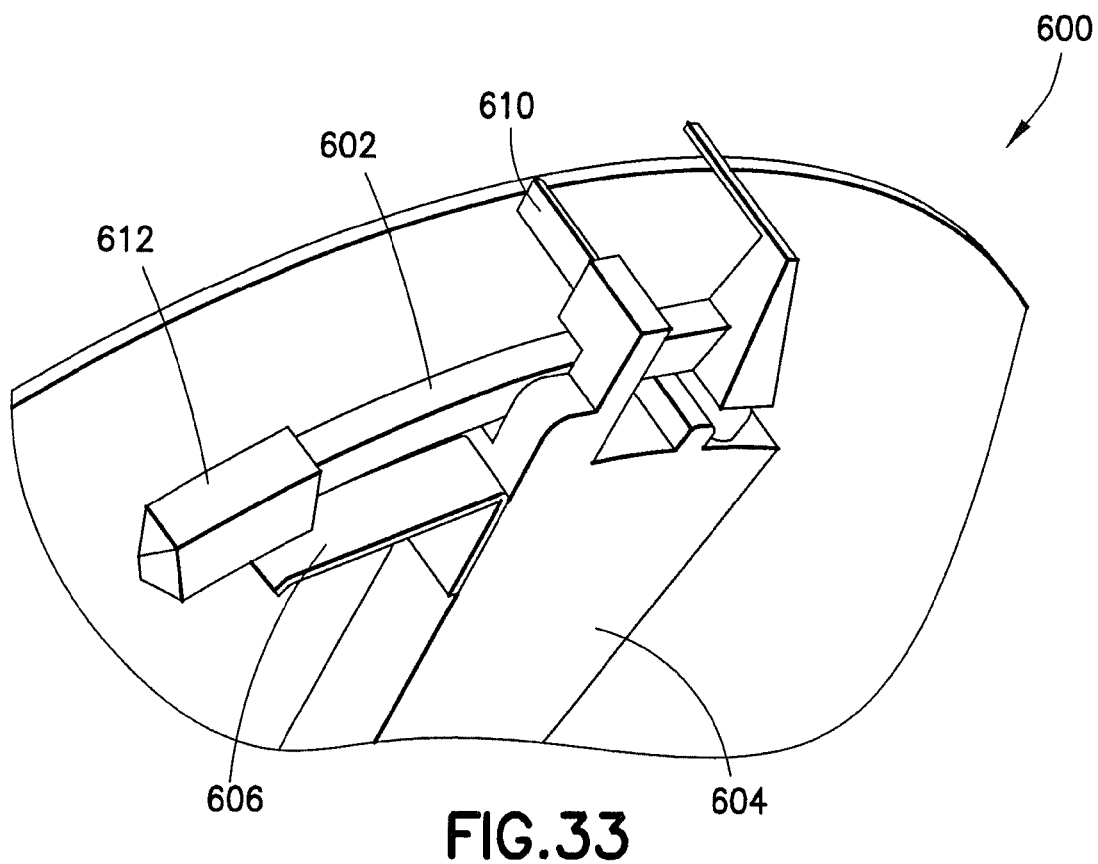
FIG. 33 shows a chuck in an unclamped position.
Figure 34:
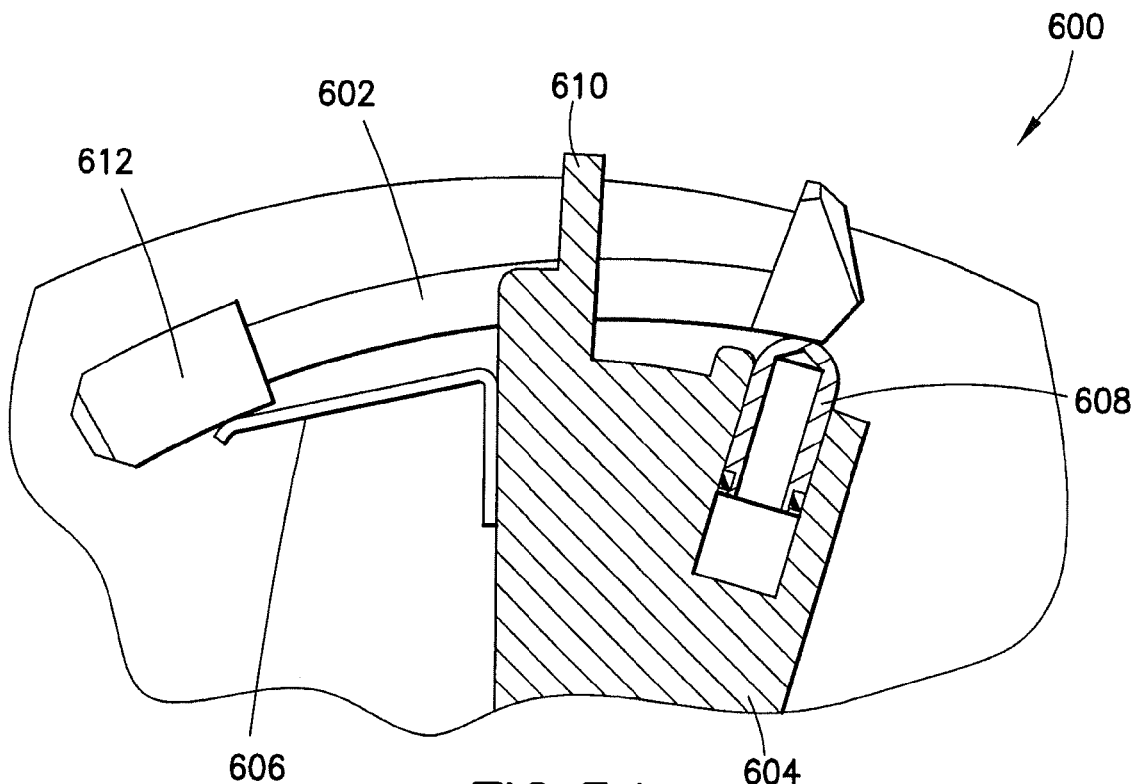
FIG. 34 shows a chuck in an unclamped position.

Referring now to FIG. 31, there is shown an alternate embodiment chuck 600 in a clamped position. Referring also to FIG. 32, there is shown chuck 600 in a clamped position. Referring also to FIG. 33, there is shown chuck 600 in an unclamped position. Referring also to FIG. 34, there is shown chuck 600 in an unclamped position. In the embodiment shown, chuck 600 has Rocker-Arm 602 mounted on Chuck 604 by a pivot point such that arm 602 is forced closed against the wafer by Spring 606 and forced open by pneumatic piston 608. In the embodiment shown, the wafer sits on a boss 610 attached to the chuck 604, and may be spaced off the Chuck 604 by ½" or otherwise to clear the backside water manifold. FIGS. 31 and 32 show the clamp closed while FIGS. 33 and 34 show the clamp open. Weight 612 may be disposed on the free end of the Rocker-Arm 602 with weight 612 being several grams heavier than the contact end of the rocker arm plus the piston, such that centripetal force causes the Rocker-Arm 602 to pivot closed against a hard stop attached or machined into the Chuck 604. The piston 608 may return primarily by spring force applied through the Rocker-Arm, and the cylinder may contain no metal components. Additionally, the piston may be pulled in by switching the cylinder pressure to vacuum. In the embodiment shown, spring force may be largest in the open position and decreases toward closed position, hence piston 608 may apply enough force to overcome spring 606 and center a wafer, approximately 2 lbs. of force or otherwise. In the embodiment shown, spring 606 is a leaf spring where spring 606 may be fitted into the Chuck either as shown with simple mounting and adjustment, or if the Chuck is a full circle, attached on an approximately tangent surface. A coil spring alternately may be used.

Figure 35:
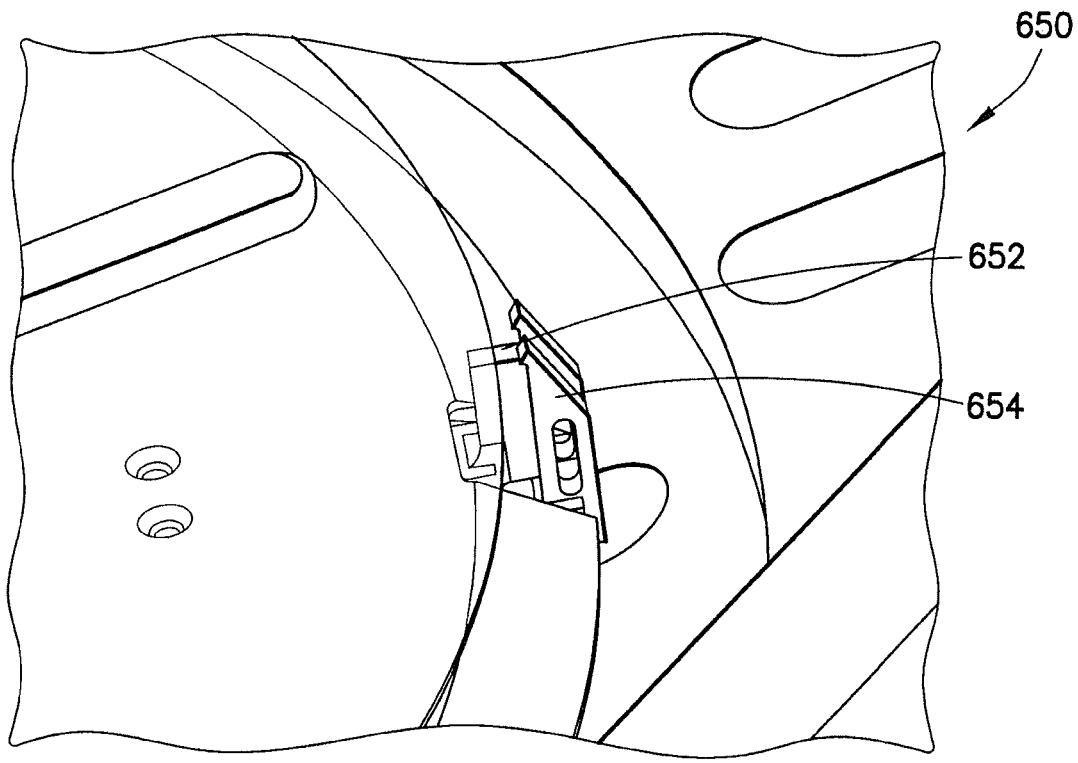
FIG. 35 shows a chuck in an unclamped position.
Figure 36:
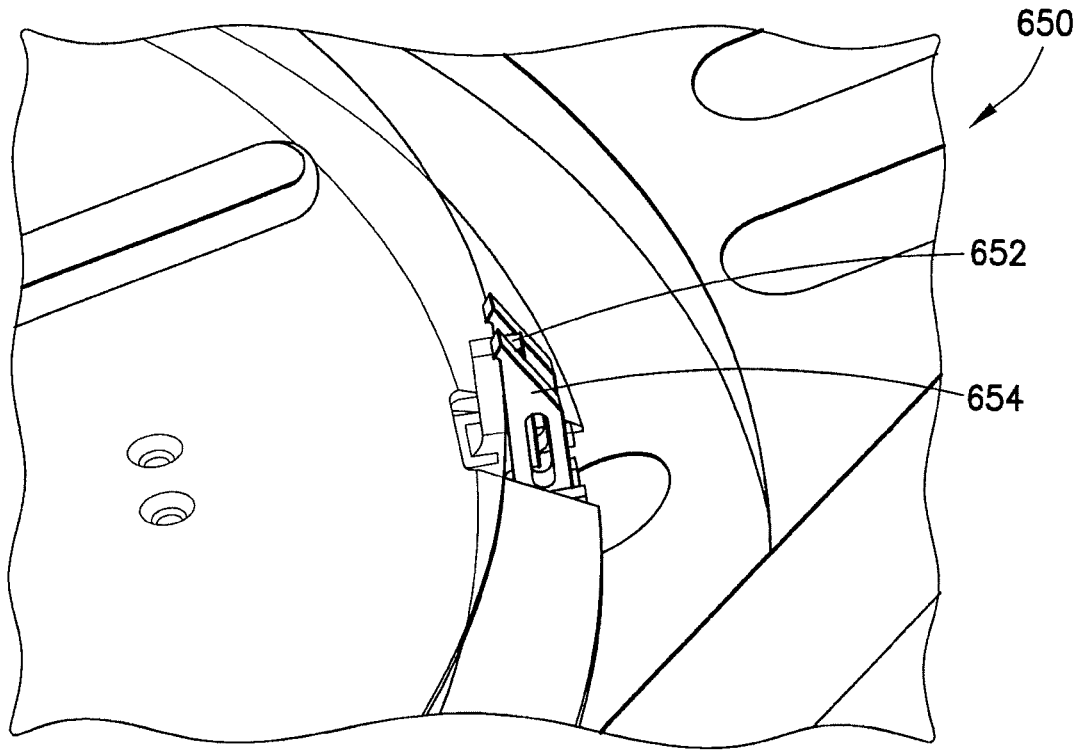
FIG. 36 shows a chuck in a clamped position.
Figure 37:
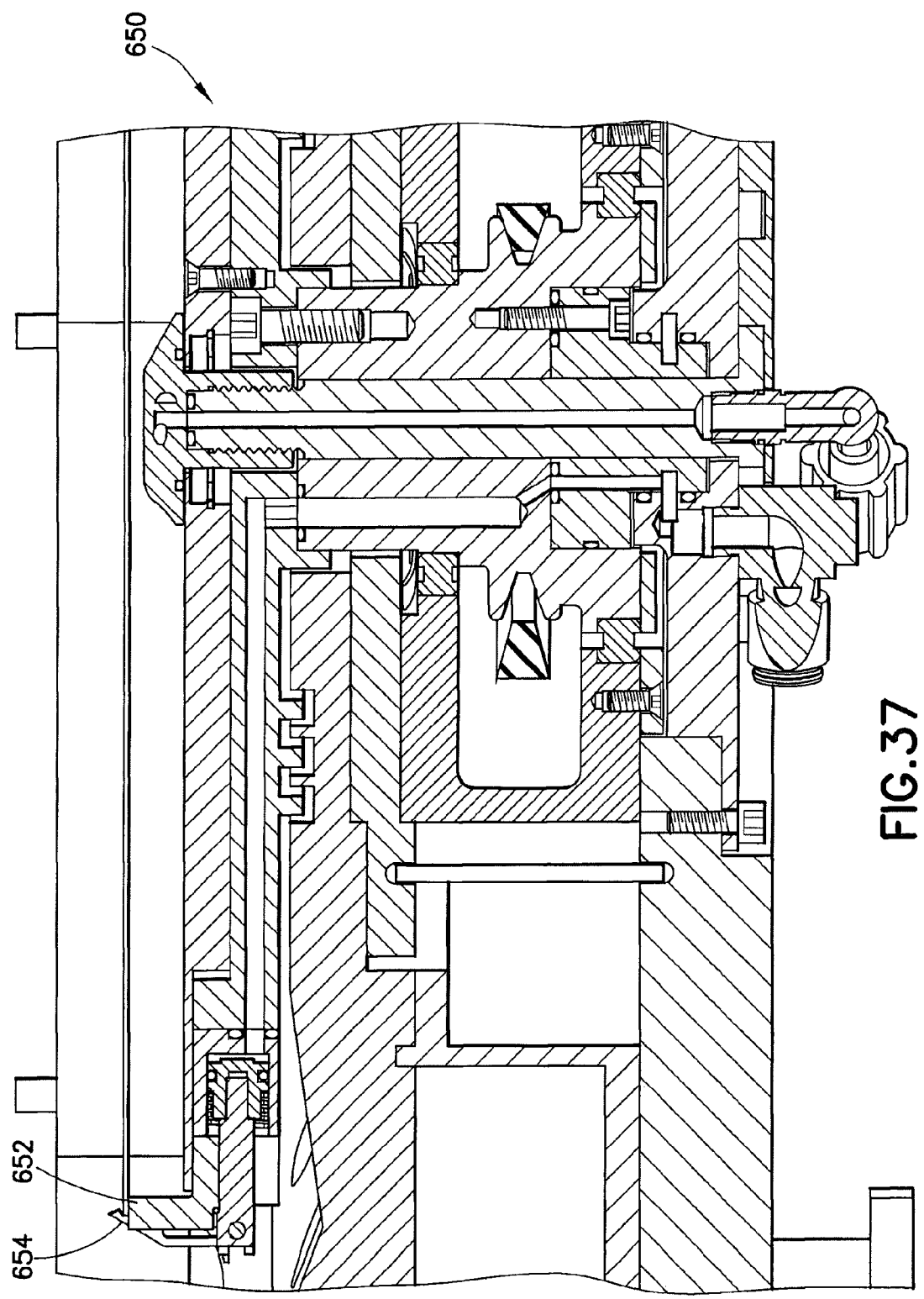
FIG. 37 shows a section view of a chuck.
Figure 38:
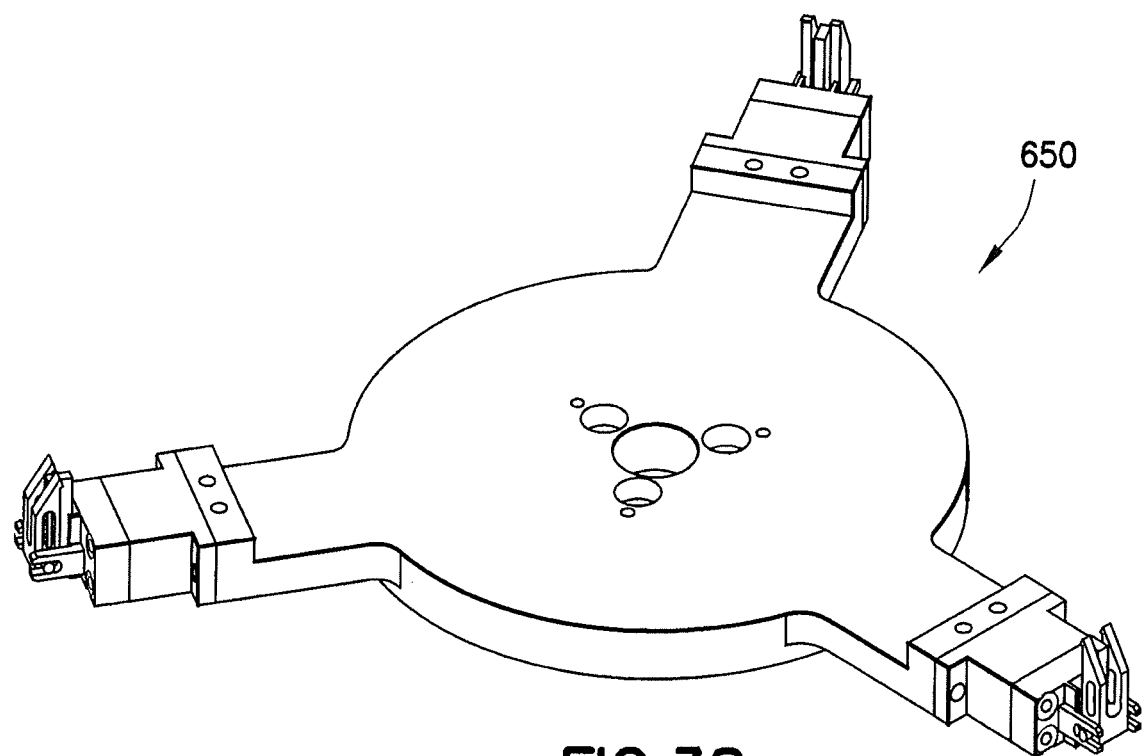
FIG. 38 shows an isometric view of a chuck.
Figure 39:
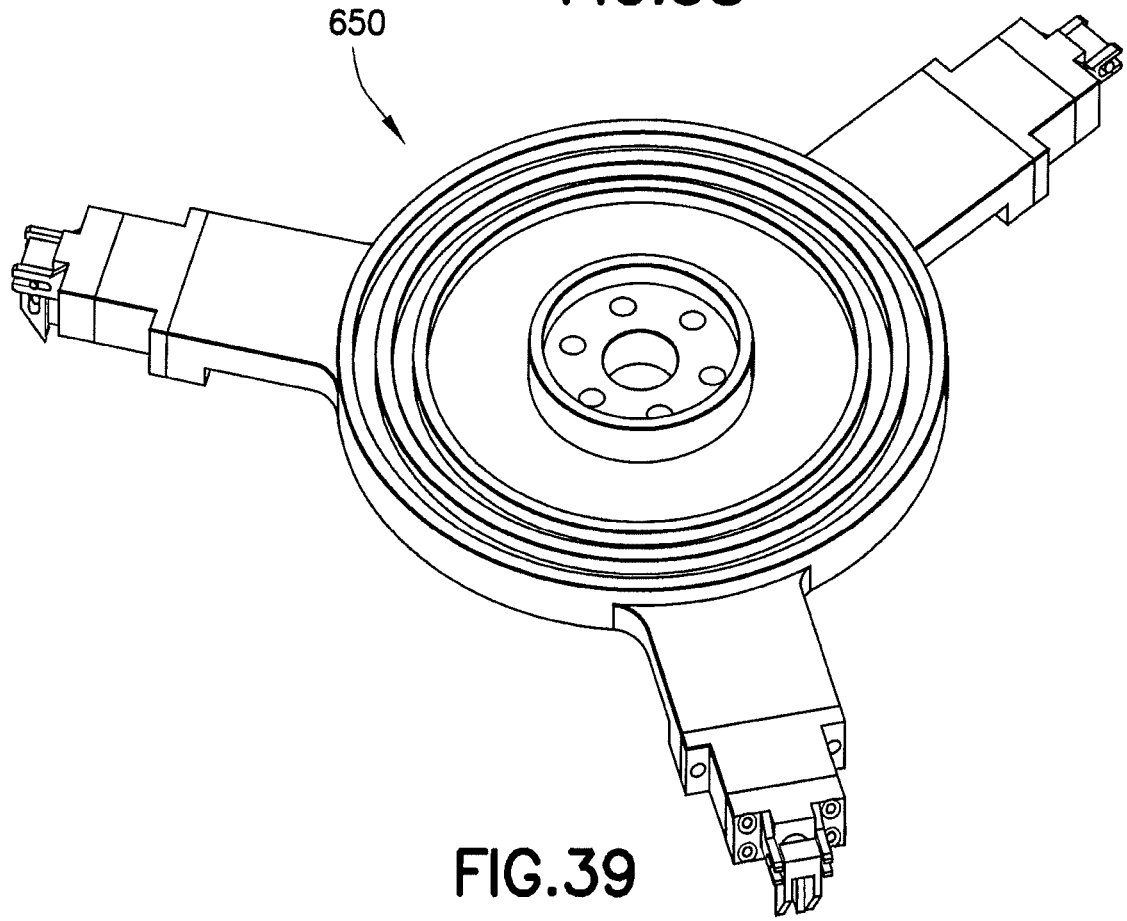
FIG. 39 shows an isometric view of a chuck bottom.
Figure 40:
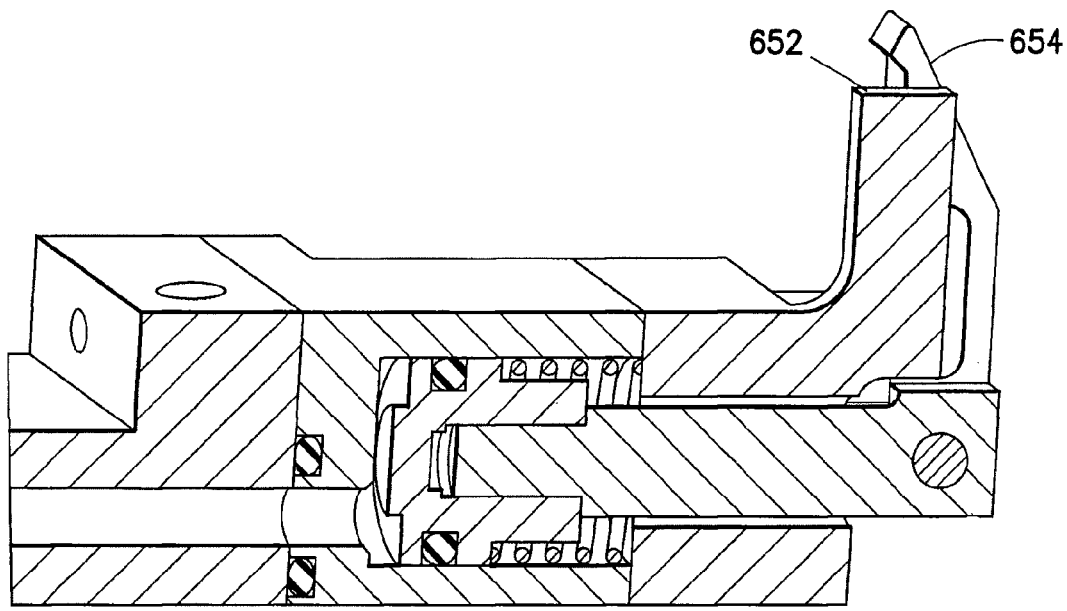
FIG. 40 shows a chuck in a clamped position.
Figure 41:
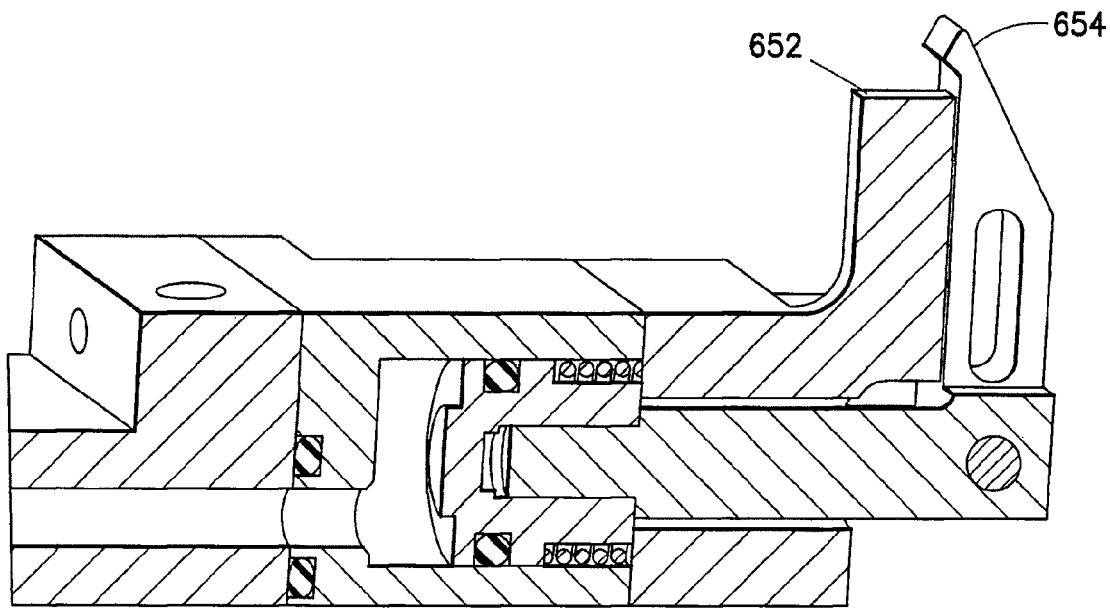
FIG. 41 shows a chuck in an unclamped position.

Referring now to FIG. 35, there is shown an alternate embodiment chuck 650 in an unclamped position. Referring also to FIG. 36, there is shown chuck 650 in a clamped position. In the embodiment shown a mechanism is provided having a spring to grip with possible vacuum assist and pneumatic pressure to un-grip. Further, the embodiment may utilize a DI water delivery system to a stationary manifold under the wafer. Approximately 1 mm of over travel may be provided in the gripped position. In the embodiment shown wafer support post 652 and clamping member 654 are provided. Post 652 may have an allowance of 3 to 4 mm or otherwise for offset wafer placement by the end effector. The components in contact with the wafer edge and underside may be made of PEEK or any other suitable material. Referring also to FIG. 37, there is shown a section view of chuck 650. In FIG. 37, a full cross-section view along vacuum/pressure feed line leading to the edge grip mechanism is shown. Referring also to FIG. 38, there is shown an isometric view of chuck 650. Referring also to FIG. 39, there is shown an isometric view of a chuck 650 underside. In the embodiment shown, attachment features and labyrinth seals align and mate to existing bowl or frame of the SRD module. Referring now to FIG. 40, there is shown chuck 650 in a clamped position. Referring also to FIG. 41, there is shown chuck 650 in an unclamped position. In the embodiment shown, a spring may provide the gripping force, and may be uniform across (6) fingers or otherwise where the spring for force may resist the centrifugal force and not allow the finger to move outward.

Figure 43:
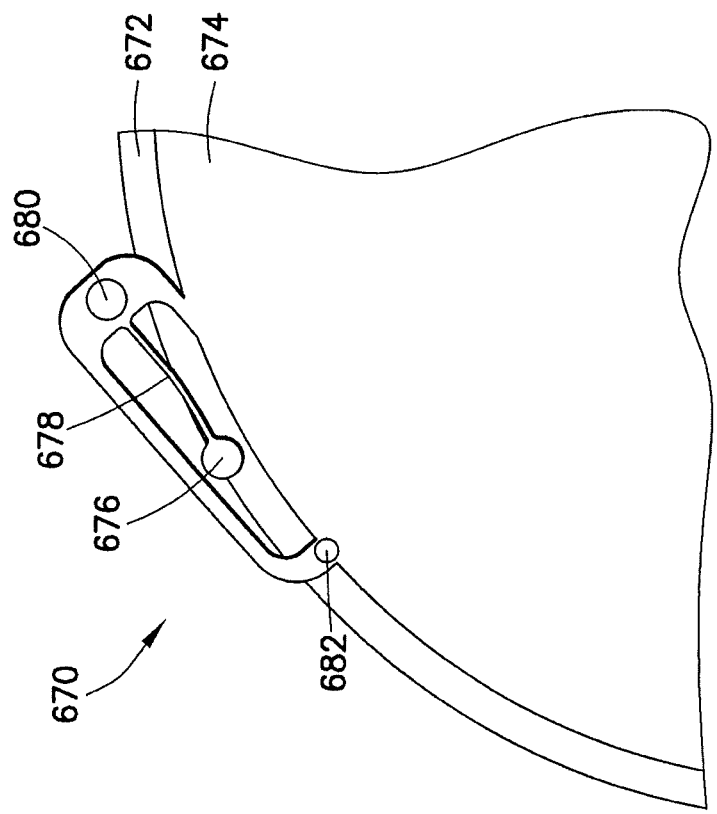
FIG. 43 shows a chuck in a clamped position.
Figure 42:
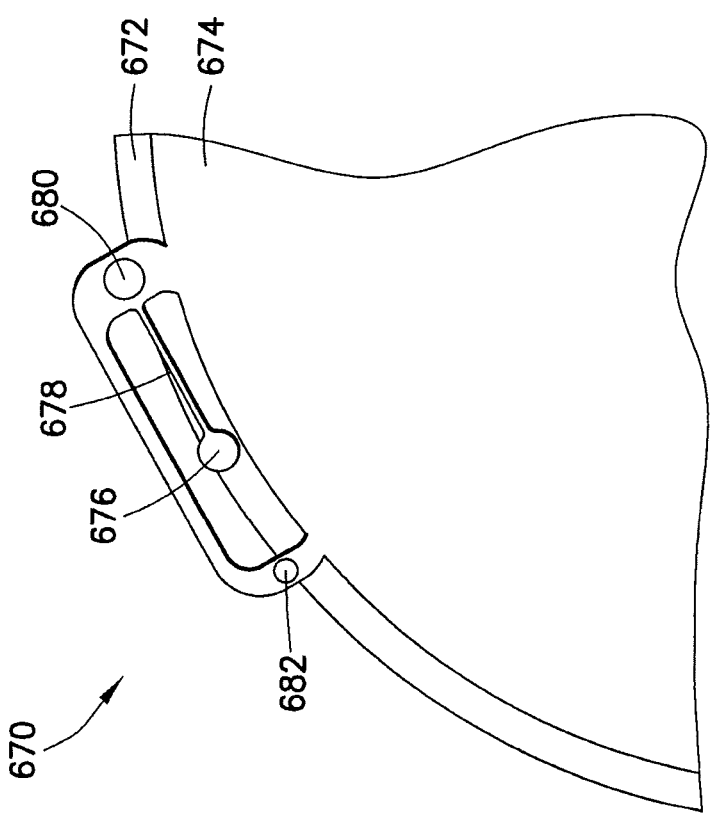
FIG. 42 shows a chuck in an unclamped position.

Referring now to FIG. 42, there is shown a chuck in an unclamped position. Referring also to FIG. 43, there is shown a chuck in a clamped position. In the embodiment shown, exemplary clamp 670 is mounted to chuck 672 for the clamping of wafer 674. Clamp 670 may have a counterweighted edge clamp portion having counterweight 680 and a clamp member 682 that contacts the edge of wafer 674 upon exceeding a predetermined speed where clamp member 674 may have features as described with respect to previously described embodiments or otherwise. Clamp 670 may be mounted to chuck 672 with post 676 where counter weighted edge clamp portion is shown coupled to post 676 by flexure 678 where post 676 is grounded to chuck 672 and the counter weighted edge portion pivots with respect to post 676 to engage the edge of wafer 674 with clamp portion 682 with a curved clamp surface that rotates at the critical speed to engage the edge of the wafer 674. Flexure 678 applies a counter rotation torque to the edge clamp portion 682 to pre load the clamp portion in the unclamped position as seen in FIG. 42 when chuck 672 is stationary and setting the critical speed at which the edge grip portion 364 engages the wafer edge. Two pins may be provided in rotary chuck 672 to establish stops, for example, to preload the counter weighted edge clamp against a stop in the position shown in FIG. 42 where flexure 678 establishes the preload or to provide an over travel stop, as in the case where a wafer is not present.

Figure 44:
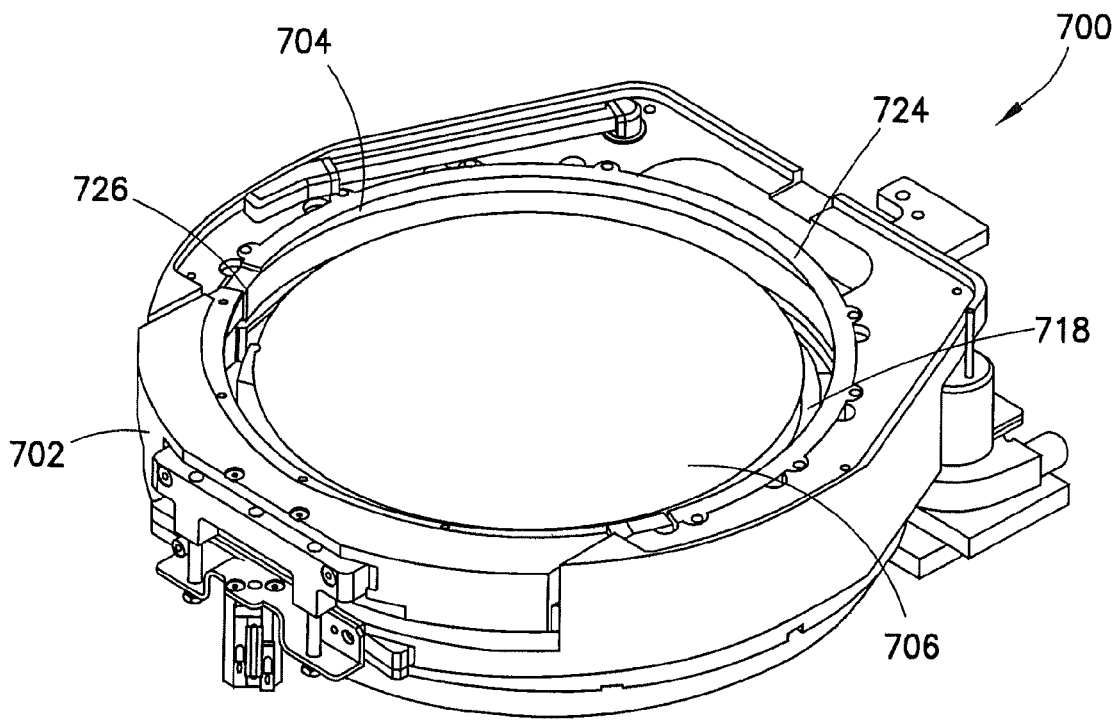
FIG. 44 shows an isometric view of a spin rinse dry (SRD) module.
Figure 45:
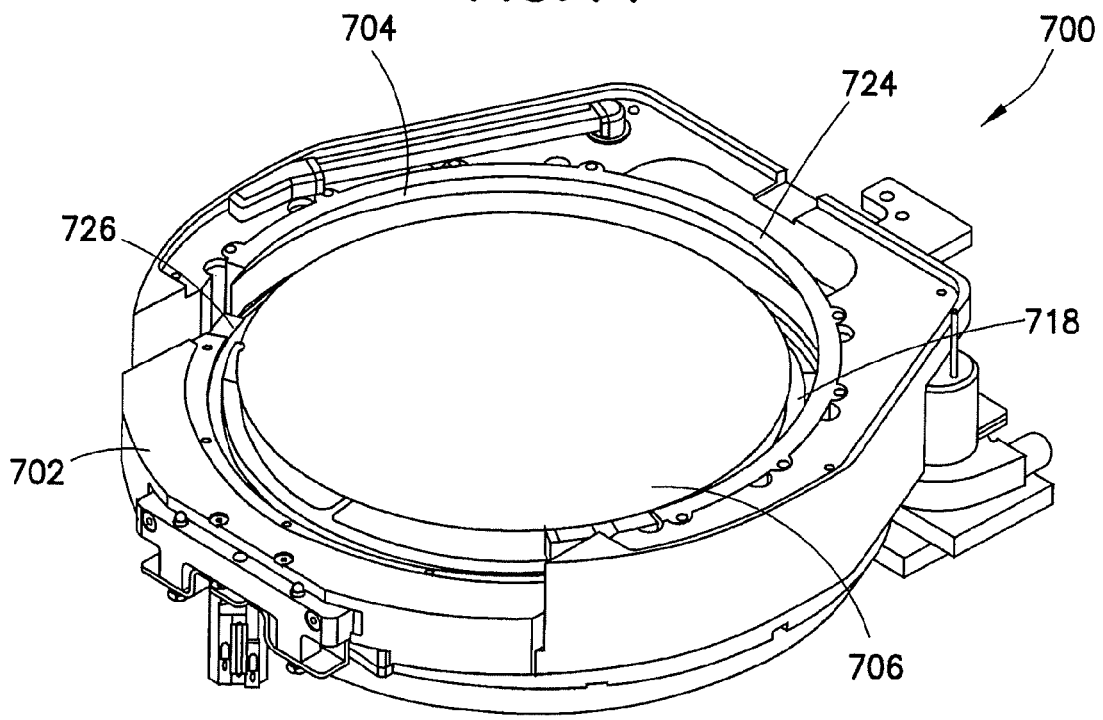
FIG. 45 shows an isometric view of a spin rinse dry (SRD) module.
Figure 46:
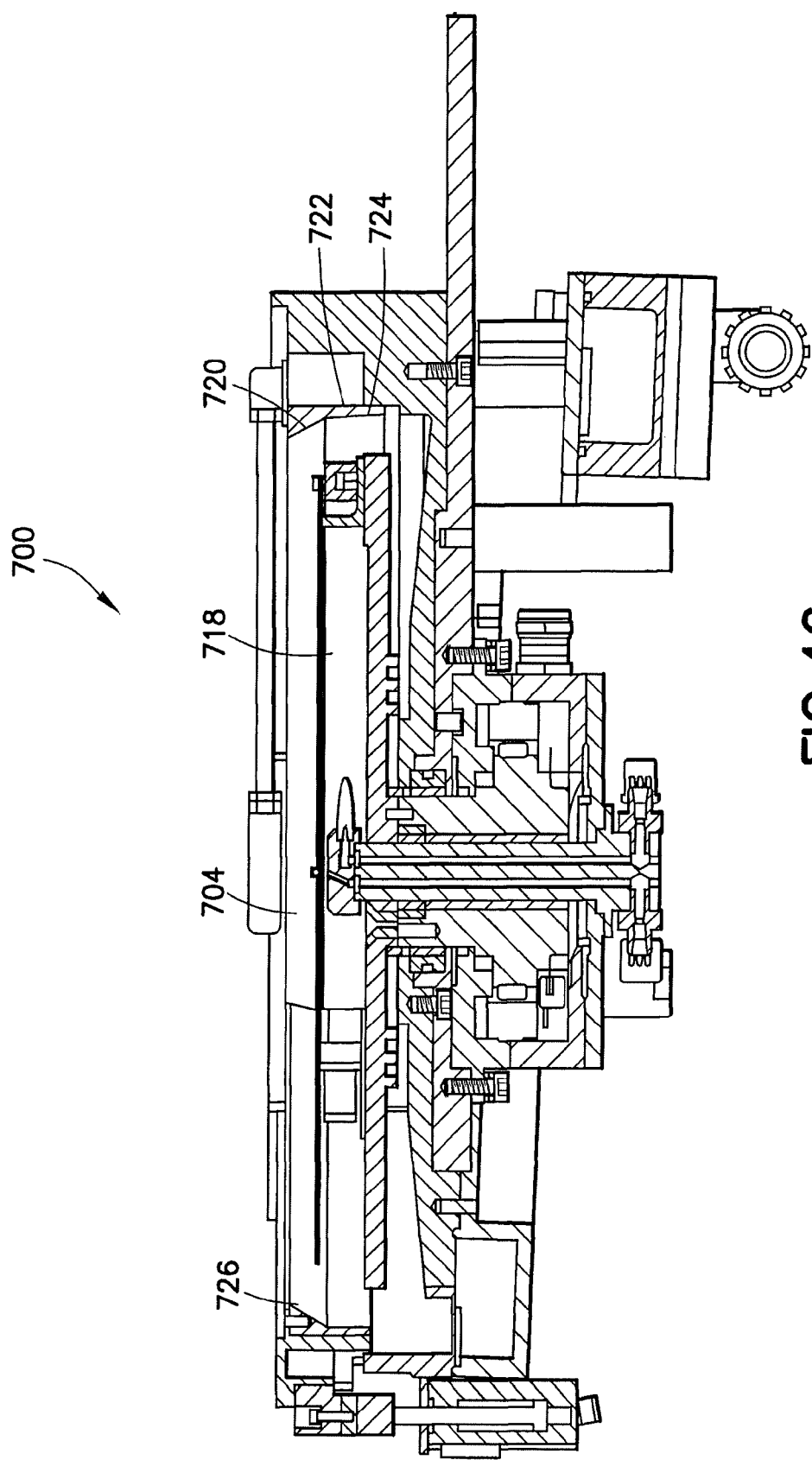
FIG. 46 shows a section view of a spin rinse dry (SRD) module.

Referring now to FIG. 44, there is shown an isometric view of a spin rinse dry (SRD) module 700. Referring also to FIG. 45, there is shown an isometric view of a spin rinse dry (SRD) module 700. Referring also to FIG. 46, there is shown a section view of a spin rinse dry (SRD) module 700. Referring also to FIG. 47, there is shown an isometric section view of a spin rinse dry (SRD) module 700. In the embodiment shown, spin rinse dry module 700 has chuck 718 supporting wafer 706, gate 702 and air diverter 704 having stationary portion 724 coupled to the enclosure and gate portion 726 moveable with gate 702. In the embodiment shown, an air diverter 704 may be used to direct air, for example, with entrapped moisture droplets below the wafer surface, for example toward the exhaust plenum, located in the base of Spin Rinse Dryer (SRD) 700. Air diverter 704 is shown axisymmetric, and may surround the edge-grip chuck where air diverter may be split having a portion 724 grounded to the base of spin rinse dryer 700 and a portion 726 that moves with robot transfer access gate 702 where gate 702 is shown closed in FIG. 44 and open in FIG. 45 allowing substrate transfer access. By directing the moisture so it may be exhausted, the diverter 704 prevents water drops from accumulating on walls or surfaces of Spin Rinse Dryer (SRD) 700. This prevents accumulation of moisture which might be blown or drip onto wafers in later runs, which would cause water spot defect density. As seen in FIG. 46, air diverter 704 has beveled portion 720 and vertical portion 722 provided to direct air or gas, for example, with entrapped moisture droplets toward the exhaust plenum, located in the base of Spin Rinse Dryer (SRD) 700. In alternate embodiments, any suitable shape or combination of shapes may be provided. As seen in FIG. 47 and in the embodiment shown, wafer support structure 750 is shown on a rotating chuck where wafer support structure 750 has a wafer support pad 752 and an edge grip support post 754. Wafer support pad 752 may be made from Santoprene from Exxon Mobil as a material to support wafer 718 with a high coefficient of friction so as to prevent slippage, for example, during a lower speed process, such as an edge bevel etch process for example as disclosed in U.S. provisional patent application Ser. No. 61/527,810 having filing date of Aug. 26, 2011 and entitled "EDGE BEVEL REMOVAL APPARATUS AND METHOD", which is incorporated by reference herein in its entirety, where the edge clamp portion 756 does not engage the edge of substrate 718 due to chuck rotation below the critical predetermined speed. In alternate embodiments, other suitable materials may be used. In the embodiment shown, the wafer support structure with support 752 is shown away from the substrate edge. Rotating edge grip portion 756 has grip member 758 that pivots on support post 754 and is adapted to engage the edge of wafer 718 during a spin rinse dry operation, for example, above 600 rpm but not below, for example, below 200 rpm. In this manner, a secondary operation, for example an edge bevel etch operation may be conducted independent of a spin rinse dry operation.

In accordance with one exemplary embodiment, a rotary chuck is provided adapted to hold a substrate, The rotary chuck has a rotatable chuck portion and an edge grip having a movable grip member movably mounted to the rotating chuck portion, the moveable grip member being substantially free moving so that rotation of the rotatable chuck portion causes the moveable grip member to move in a plane substantially aligned with a surface of the substrate to engage the substrate in a engaged position. A resilient element is coupled to the moveable grip member, the resilient member biasing the grip member to a disengaged position.

In accordance with another exemplary embodiment, a substrate holder adapted to hold a substrate on a rotary chuck is provided. The substrate holder has a counter-weighted edge clamp portion that pivots on a pivot axis offset from and substantially parallel to an axis of rotation of the rotary chuck. A counter spring is connected to the clamp portion so that the spring applies a counter torque to the counter-weighted edge clamp portion. The counter-weighted edge clamp portion overcomes the counter spring and engages the substrate in response to the rotary chuck exceeding a predetermined angular velocity.

In accordance with another exemplary embodiment, a substrate holder adapted to hold a substrate is provided. The substrate holder has a rotary chuck having a seat for supporting the substrate. An inertially actuated edge grip is movably mounted to the rotary chuck, the inertially actuated edge grip having a substrate contact member movable relative to the rotary chuck for effecting edge grip clamping of the substrate on the rotary chuck. The substrate contact member is configured so that movement of the substrate contact member to contact the substrate is in a plane substantially orthogonal to an axis of rotation of the rotary chuck. The movement of the substrate contact member to contact the substrate is effected by inertia effects generated by rotation of the rotary chuck about the axis of rotation at a predetermined angular velocity.

In accordance with another exemplary embodiment, a spin rinse dry device adapted to rotate and hold a substrate during a rinsing or drying operation is provided. The spin rinse dry device has an enclosure and a rotary chuck for supporting a wafer, the rotary chuck rotatable on an axis of rotation within the enclosure. A counter-weighted edge clamp pivots on a pivot axis offset from and substantially parallel to the axis of rotation. The counter-weighted edge clamp engages the substrate with a force activated by centripetal force in response to the rotary chuck exceeding a predetermined angular velocity.

It should be understood that the foregoing description is only illustrative of the invention. Various alternatives and modifications can be devised by those skilled in the art without departing from the invention. Accordingly, the present invention is intended to embrace all such alternatives, modifications and variances.

What is claimed is:

1. A rotary chuck configured to hold a substrate, the rotary chuck comprising:
   a rotatable chuck portion;
   an edge grip having a movable grip member movably mounted to the rotatable chuck portion, the movable grip member being substantially free moving;
   a pivot coupled to the rotatable chuck portion with an axis of rotation that is substantially aligned with an axis of the rotary chuck, the movable grip member coupled to the rotatable chuck portion and pivot such that rotation of the rotatable chuck portion causes the movable grip member to rotate on the axis of rotation of the pivot; and
   a resilient element coupled to the movable grip member, and the resilient member further coiled around the pivot such that when the rotary chuck is stationary, the resilient member causes the movable grip member to rotate to a disengaged position.

2. The rotary chuck of claim 1 wherein the movable grip member engages the substrate upon the rotatable chuck portion exceeding a predetermined angular velocity.

3. The rotary chuck of claim 1 further comprising:
   a first stop coupled to the rotatable chuck portion, the first stop configured to limit rotation of the movable grip member in the disengaged position; and
   a second stop coupled to the rotatable chuck portion, the second stop configured to limit rotation of the movable grip member in an engaged over travel position.

4. The rotary chuck of claim 1 wherein the movable grip member further comprises a capture portion configured to retain the substrate in an axial direction with respect to an axis of rotation of the rotatable chuck portion.

5. The rotary chuck of claim 1 further comprising a pivot and a seal disposed between the pivot and the movable grip member, wherein the movable grip member pivots on the pivot.

6. The rotary chuck of claim 1 wherein the movable grip member is coupled to the rotatable chuck portion with a flexure.

* * * * *